(12) United States Patent
Shimazaki et al.

(10) Patent No.: US 12,358,263 B2
(45) Date of Patent: *Jul. 15, 2025

(54) METHOD FOR PROTECTING LOW-E GLASS PLATE, METHOD FOR PRODUCING GLASS UNIT, LAMINATE AND PROTECTIVE SHEET FOR LOW-E GLASS PLATE

(71) Applicant: NITTO DENKO CORPORATION, Ibaraki (JP)

(72) Inventors: Yuta Shimazaki, Ibaraki (JP); Kosuke Yonezaki, Ibaraki (JP); Hakaru Horiguchi, Ibaraki (JP); Kunimasa Mishima, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 528 days.

This patent is subject to a terminal disclaimer.

(21) Appl. No.: 17/619,879

(22) PCT Filed: Jun. 23, 2020

(86) PCT No.: PCT/JP2020/024557
§ 371 (c)(1),
(2) Date: Dec. 16, 2021

(87) PCT Pub. No.: WO2020/262356
PCT Pub. Date: Dec. 30, 2020

(65) Prior Publication Data
US 2022/0371304 A1   Nov. 24, 2022

(30) Foreign Application Priority Data
Jun. 27, 2019 (JP) ................. 2019-120483

(51) Int. Cl.
B32B 17/10 (2006.01)
B32B 7/12 (2006.01)
(Continued)

(52) U.S. Cl.
CPC ................ B32B 17/10 (2013.01); B32B 7/12 (2013.01); B32B 27/36 (2013.01); B32B 37/12 (2013.01);
(Continued)

(58) Field of Classification Search
None
See application file for complete search history.

(56) References Cited

U.S. PATENT DOCUMENTS 11,760,066 B2 * 9/2023 Shimazaki .............. B32B 27/16
156/247
2002/0176988 A1   11/2002 Medwick et al.
(Continued)

FOREIGN PATENT DOCUMENTS

CN   103842461 A   6/2014
EP   2 511 357 A1   10/2012
(Continued)

OTHER PUBLICATIONS

European Search Report dated Jul. 11, 2023, issued in EP Appln 20833597.6.
(Continued)

*Primary Examiner* — Kim S. Horger
(74) *Attorney, Agent, or Firm* — Sughrue Mion, PLLC

(57) ABSTRACT

Provided is a Low-E glass plate protection method capable of preventing or inhibiting Low-E layer alteration. In the protection method, a protective sheet having a substrate and a PSA layer provided to at least one face of the substrate is applied for protection via the PSA layer to a Low-E glass plate having a Low-E layer that comprises a zinc compo-
(Continued)

nent. The method is characterized by using the protective sheet wherein the PSA layer is formed from a water-dispersed PSA composition and includes less than 850 μg ammonia per gram of PSA layer weight.

20 Claims, 2 Drawing Sheets

(51) Int. Cl.
    *B32B 27/36*     (2006.01)
    *B32B 37/12*     (2006.01)
    *B32B 37/18*     (2006.01)
    *B32B 43/00*     (2006.01)
    *C03C 17/34*     (2006.01)
    *C09J 5/00*     (2006.01)
    *C09J 7/32*     (2018.01)
    *C09J 7/38*     (2018.01)
    *C09J 11/04*     (2006.01)
    *C23C 14/08*     (2006.01)
    *C23C 14/18*     (2006.01)
    *C23C 14/35*     (2006.01)

(52) U.S. Cl.
    CPC .......... *B32B 37/182* (2013.01); *B32B 43/006* (2013.01); *C03C 17/3429* (2013.01); *C09J 5/00* (2013.01); *C09J 7/32* (2018.01); *C09J 7/385* (2018.01); *C09J 11/04* (2013.01); *C23C 14/083* (2013.01); *C23C 14/086* (2013.01); *C23C 14/185* (2013.01); *C23C 14/352* (2013.01); *B32B 2255/205* (2013.01); *B32B 2255/28* (2013.01); *B32B 2307/748* (2013.01); *B32B 2315/08* (2013.01); *B32B 2367/00* (2013.01); *C03C 2217/212* (2013.01); *C03C 2217/216* (2013.01); *C03C 2217/27* (2013.01); *C03C 2217/74* (2013.01); *C03C 2218/156* (2013.01); *C09J 2301/306* (2020.08); *C09J 2301/408* (2020.08); *C09J 2400/10* (2013.01); *C09J 2433/00* (2013.01)

(56) References Cited

U.S. PATENT DOCUMENTS

| | | | |
|---|---|---|---|
| 2005/0210921 A1* | 9/2005 | Richardson | C03C 17/42 65/106 |
| 2012/0135231 A1 | 5/2012 | Yoshida et al. | |
| 2012/0219795 A1 | 8/2012 | Mitsui et al. | |
| 2013/0019637 A1 | 1/2013 | Sol et al. | |
| 2013/0059960 A1* | 3/2013 | Koso | C09J 133/08 524/251 |
| 2013/0344327 A1 | 12/2013 | Yoshida et al. | |
| 2014/0158300 A1 | 6/2014 | Hayata et al. | |
| 2014/0226085 A1 | 8/2014 | Katami et al. | |
| 2014/0227502 A1 | 8/2014 | Katami et al. | |
| 2015/0376477 A1 | 12/2015 | Katami et al. | |
| 2016/0137884 A1 | 5/2016 | Yamamoto et al. | |
| 2017/0283661 A1 | 10/2017 | Yonezaki et al. | |

FOREIGN PATENT DOCUMENTS

| | | |
|---|---|---|
| EP | 2 150 669 B1 | 2/2016 |
| EP | 3 992 163 A1 | 5/2022 |
| EP | 3 992 164 A1 | 5/2022 |
| EP | 3 992 165 A1 | 5/2022 |
| JP | 9-78044 A | 3/1997 |
| JP | 2002-180026 A | 6/2002 |
| JP | 2003-504227 A | 2/2003 |
| JP | 3571460 B2 | 9/2004 |
| JP | 2009-1606 A | 1/2009 |
| JP | 2012-126855 A | 7/2012 |
| JP | 2012-131976 A | 7/2012 |
| JP | 2012-177036 A | 9/2012 |
| JP | 2013-040323 A | 2/2013 |
| JP | 2014-043557 A | 3/2014 |
| JP | 2014-177611 A | 9/2014 |
| JP | 5719194 B2 | 5/2015 |
| JP | 2015-105353 A | 6/2015 |
| JP | 2015-162716 A | 9/2015 |
| JP | 2015-168716 A | 9/2015 |
| JP | 2016-102195 A | 6/2016 |
| JP | 2017-186517 A | 10/2017 |
| JP | 6294978 B1 | 3/2018 |
| JP | 2018-123028 A | 8/2018 |
| KR | 10-2007-0017901 A | 2/2007 |
| WO | 01/02496 A2 | 1/2001 |
| WO | 02/092715 A1 | 11/2002 |
| WO | 2016/139318 A1 | 9/2016 |
| WO | 2019/130611 A1 | 7/2019 |
| WO | 2019/130612 A1 | 7/2019 |
| WO | 2019/130613 A1 | 7/2019 |
| WO | 2020/262356 A1 | 12/2020 |
| WO | 2020/262357 A1 | 12/2020 |
| WO | 2020/262358 A1 | 12/2020 |

OTHER PUBLICATIONS

First Office Action issued Jan. 2, 2024 by The State Intellectual Property Office of People's Republic of China in Chinese Application No. 202080047101.8.
International Search Report for PCT/JP2020/024557 dated Sep. 24, 2020 [PCT/ISA/210].
Written Opinion for PCT/JP2020/024557 dated Sep. 24, 2020 [PCT/ISA/237].
Extended European Search Report issued Mar. 26, 2024 in Application No. 21793282.1.
International Search Report for PCT/JP2021/014690 dated Jul. 6, 2021.
Office Action issued May 31, 2024 in U.S. Appl. No. 17/919,968.

* cited by examiner

[Fig. 2]

METHOD FOR PROTECTING LOW-E GLASS PLATE, METHOD FOR PRODUCING GLASS UNIT, LAMINATE AND PROTECTIVE SHEET FOR LOW-E GLASS PLATE

TECHNICAL FIELD

The present invention relates to a method for protecting a Low-E glass plate, a method for producing a glass unit, a laminate and a protective sheet for a Low-E glass plate.

This application is a National Stage of International Application No. PCT/JP2020/024557 filed Jun. 23, 2020, claiming priority based on Japanese Patent Application No. 2019-120483 filed on Jun. 27, 2019, the entire content thereof is incorporated herein by reference.

BACKGROUND ART

In processing and transporting various articles, in known techniques to prevent damage (scratches, contamination, corrosion, etc.) of their surfaces, protective sheets are bonded to the surfaces for protection. The objects to be protected vary widely. For instance, protective sheets are used on glass plates bearing Low-E (Low-Emissivity) layers (or Low-E glass plates) as well. Low-E glass plates are preferably used as building materials such as window glass because of the effects of the Low-E layers to improve the efficiency to cool down and heat up indoor spaces. In producing a Low-E glass plate, usually, until a Low-E glass plate and another glass plate are assembled into a pair-glass (e.g. dual-pane glass) with the Low-E layer surface on the inside, a protective sheet is applied to the Low-E layer surface which will be otherwise left exposed. This protects the Low-E layer from damage, wearing, degradation, corrosion, etc. Conventional art documents related to methods for producing glass units include Patent Documents 1 and 2.

For the surface protection, as a removable bonding means, pressure-sensitive adhesive (or PSA; the same applies hereinafter) can be preferably used. In general, pressure-sensitive adhesive has characteristics of being in a soft solid (viscoelastic) state in a room temperature range and easily adhering to adherend under some pressure. A surface protective sheet using PSA typically has a PSA layer on one face of a substrate sheet formed of a material such as resin and is constituted so as to achieve a protection purpose when the PSA layer is applied to an adherend (an object to be protected). Conventional art documents disclosing PSA sheets usable as surface protective sheets include Patent Documents 3 to 6. Patent Document 3 discloses a surface protective sheet that protects the surface of a metal plate while it is being drawn. Patent Document 4 discloses a surface protective sheet for optical film such as polarizing plates. Patent Document 5 relates to a surface protective sheet for a self-cleaning hydrophilic coated plate. Patent Document 6 is directed to easy removal of a surface protective sheet for metal plates on which top coats are formed and to reduction of the degree of contamination caused by it.

CITATION LIST

Patent Literature

[Patent Document 1] European Patent No. 2150669
[Patent Document 2] WO 2016/139318
[Patent Document 3] Japanese Patent Application Publication No. 2017-186517
[Patent Document 4] Japanese Patent No. 5719194
[Patent Document 5] Japanese Patent Application Publication No. 2012-131976
[Patent Document 6] Japanese Patent No. 3571460

SUMMARY OF INVENTION

Solution to Problem

Protection of a Low-E glass plate with a protective sheet can block not only physical damage such as breakage and abrasion, but also the entrance of water, moisture, etc. Low-E glass plates are protected with protective sheets when exposed to external environments and subjected to processes such as processing and washing. Accordingly, protective sheets are required to have properties to prevent the degradation and corrosion in such environments. However, for Low-E glass plate transportation, storage and so on, protection with protective sheets sometimes needs to last for a long period; and even in such a case, protective sheets are expected to prevent the degradation and corrosion to satisfactory levels.

Because of these circumstances, by the present inventors, a study has been conducted on prevention of degradation and corrosion in Low-E glass plates; and despite of sufficient protection using protective sheets, alteration in Low-E layers has been found. In the study, it has been found that the protective sheet itself can cause alteration to Low-E layers and the present invention has been made upon investigation of the cause. An objective of this invention is to provide a Low-E glass plate protection method capable of preventing or inhibiting alteration in Low-E layers. Other objectives of this invention include providing a glass unit production method, providing a laminate, and providing a protective sheet for Low-E glass plates.

Solution to Problem

This Description provides a method for protecting a Low-E glass plate. In the Low-E glass plate protection method, a protective sheet having a substrate and a PSA layer provided to at least one face of the substrate is applied for protection via the PSA layer to a Low-E layer included in a Low-E glass plate. The low-E layer comprises a zinc component. This method is characterized by use of the protective sheet wherein the PSA layer is formed from a water-dispersed PSA composition and includes less than 850 µg ammonia per gram of PSA layer weight.

As a result of studies, the present inventors have found that ammonia in PSA acts on zinc components of Low-E layers, causing alteration to the Low-E layers. For instance, in an embodiment where the Low-E layer has a zinc-containing layer (a layer comprising a zinc component), it may lower the density of the zinc-containing layer, causing alteration to the Low-E layer. This phenomenon may be caused by reaction between the zinc component and ammonia. Based on this finding, in the present protection method, the amount of ammonia in the PSA of the Low-E glass plate protective sheet is limited to below the prescribed value. In other words, according to the protection method, alteration of the Low-E layer in the Low-E glass plate can be prevented or inhibited with the use of a protective sheet having a PSA layer whose ammonia content according to hot water extraction is limited to below the prescribed amount. In the method, the PSA layer forming the protective sheet may comprise ammonia or may be free of ammonia.

It is noted that the "zinc component" here refers to a zinc-containing component, including zinc metal, a compound comprising zinc and other element (zinc-based compound), a composite (zinc-based composite) and a mixture (zinc-based mixture). Zinc-based compounds such as zinc oxides are typical examples of the zinc component.

In the art disclosed herein (encompassing the Low-E glass protection method, glass unit production method, laminate and Low-E glass plate protective sheet; the same applies hereinafter), the method according to some embodiments further includes a step of removing the protective sheet from the Low-E glass plate. Between the application and removal of the protective sheet to and from the Low-E glass plate, the method includes a step of subjecting the Low-E glass plate having the protective sheet applied thereon to at least one process selected from the group consisting of transportation, storage, processing, washing and handling. In an embodiment of such use of the Low-E glass plate, by using the protective sheet, protection of the Low-E glass plate is realized.

In some embodiments of the art disclosed herein, the Low-E glass plate has a width of 1 m or greater. The application of the protective sheet to the Low-E glass plate includes a step of entirely covering one face of the Low-E glass plate with at least one said protective sheet. The use of such a broad protective sheet can protect a Low-E glass plate having a large surface area with one sheet or a few sheets.

In some embodiments of the art disclosed herein, the protective sheet is adhered to the Low-E glass plate with a 180° peel strength of 5 N/20 mm or less. By this, when the protection period ends, the protective sheet can be removed from the Low-E glass plate by relatively low peel force.

In the art disclosed herein, the Low-E layer of the Low-E glass plate may include a zinc-containing layer. The zinc-containing layer can be selected between, for instance, a zinc oxide-containing layer and a zinc oxide-containing composite layer. By limiting the amount of ammonia originated from the PSA layer of the protective sheet, alteration can be preferably prevented or inhibited in the Low-E layer having the zinc-containing layer (zinc oxide-containing layer, zinc oxide-containing composite layer, etc.).

This Description also provides a glass unit production method. The production method includes a step (A) of obtaining a Low-E glass plate having a Low-E layer; a step (B) of applying a protective sheet to a surface of the Low-E layer of the Low-E glass plate; an optional step (C) of subjecting the Low-E glass plate having the protective sheet applied thereon to at least one process selected from the group consisting of transportation, storage, processing, washing and handling; a step (D) of removing the protective sheet from the Low-E glass plate; and a step (E) of fabricating a glass unit using the Low-E glass plate. Here, the Low-E layer comprises a zinc component. The protective sheet has a substrate and a PSA layer provided to at least one face of the substrate. The PSA layer is adhered to the surface of the Low-E layer. The PSA layer is formed from a water-dispersed PSA composition. The PSA layer has less than 850 μg ammonia per gram of PSA layer weight, determined by hot water extraction. According to this production method, alteration of the Low-E layer is prevented or inhibited in the Low-E glass plate; and therefore, the resulting glass unit will be of high quality with minimal defects (discoloration, etc.).

This Description also provides a laminate. The laminate is consisted of a Low-E glass plate having a Low-E layer that comprises a zinc component and a protective sheet having a substrate and a PSA layer provided to at least one face of the substrate. The protective sheet is adhered with the PSA layer to the Low-E layer of the Low-E glass plate. The PSA layer in the protective sheet is formed from a water-dispersed PSA composition; and the PSA layer includes less than 850 μg ammonia per gram of PSA layer weight, determined by hot water extraction. According to the laminate in such an embodiment, the Low-E layer of the Low-E glass plate constituting the laminate is protected with the protective sheet having the aforementioned constitution, whereby its alteration is prevented or inhibited. In some embodiments, the PSA layer includes ammonia. The PSA layer in this embodiment includes less than 850 μg ammonia per gram.

This Description also provides a Low-E glass plate protective sheet (a protective sheet for a Low-E glass plate). The protective sheet is for protection of a Low-E glass plate having a Low-E layer that comprises a zinc component and is constituted with a PSA layer formed on a substrate. To use the protective sheet, the PSA layer is adhered to the Low-E layer of the Low-E glass plate. The PSA layer in the protective sheet is formed from a water-dispersed PSA composition and the PSA layer includes less than 850 μg ammonia per gram of PSA layer weight, determined by hot water extraction. According to the Low-E glass plate protective sheet in this embodiment, the PSA layer's ammonia content determined by hot water extraction is limited to below the prescribed value; and therefore, alteration of the Low-E layer present in the Low-E glass plate can be prevented or inhibited. In some embodiments, the PSA layer includes ammonia. The PSA layer in this embodiment includes less than 850 μg ammonia per gram.

DESCRIPTION OF EMBODIMENTS

Preferred embodiments of the present invention are described below. Matters necessary to practice this invention other than those specifically referred to in this description can be understood by a person skilled in the art based on the disclosure about implementing the invention in this description and common technical knowledge at the time of application. The present invention can be practiced based on the contents disclosed in this description and common technical knowledge in the subject field.

As used herein, the term "PSA" refers to, as described earlier, a material that exists as a soft solid (a viscoelastic material) in a room temperature range and has a property to adhere easily to an adherend with some pressure applied. As defined in C. A. Dahlquist, "Adhesion: Fundamental and Practice" (McLaren & Sons (1966), P. 143), the PSA referred to herein is a material that has a property satisfying complex tensile modulus $E^*(1\ Hz) < 10^7$ dyne/cm$^2$ (typically, a material that exhibits the described characteristics at 25° C.).

The concept of protective sheet herein may encompass so-called PSA sheet, PSA tape, PSA labels, PSA film, etc. The protective sheet disclosed herein can be in a roll or in a flat sheet. Alternatively, the protective sheet may be processed into various shapes.

<Glass Unit Production Method>

The glass unit production method disclosed herein comprises a step (A) of obtaining a Low-E glass plate comprising a glass substrate and a Low-E layer placed on the glass substrate; a step (B) of applying a protective sheet to the Low-E layer surface of the Low-E glass plate; an optional step (C) of subjecting the Low-E glass plate with the protective sheet adhered thereon to at least one process selected from the group consisting of transportation, storage, processing, washing and handling; a step (D) of removing the protective sheet from the Low-E glass plate; and a step (E) of assembling a glass unit using the Low-E glass plate. In this method, the protective sheet (or surface-protective sheet) disclosed herein is used. Further description is provided below while referring to FIGS. 1(A) to 1(E).

Figure 1A:
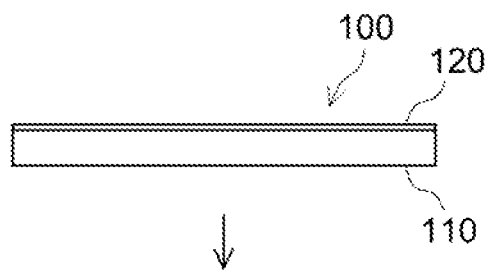
FIGS. 1(A) to 1(E) show a schematic diagram to illustrate an embodiment of the glass unit production method.
Figure 1B:
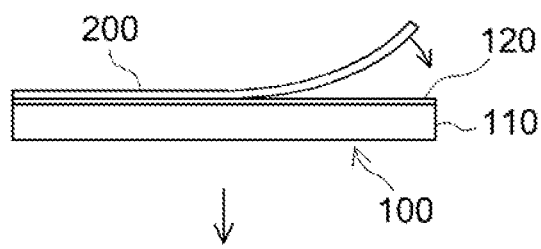

First, in the step (A), as shown in FIG. 1(A), a Low-E glass plate 100 having a Low-E layer 120 is obtained (S10). In particular, Low-E glass plate 100 can have a glass substrate 110 and a Low-E layer 120 placed on the glass substrate 110. Low-E glass plate 100 is obtained by forming Low-E layer 120 on one face of glass substrate 110. The Low-E layer comprises a metal layer, an oxide layer such as a metal oxide layer, and a nitride layer such as silicon nitride; usually has a multi-layer structure; and can be formed by a known or conventionally-used method such as sputtering. The size of the glass substrate is not particularly limited with one side (width) being, for instance, about 1 m or greater, or about 2 m or greater. Lately, pieces having surface areas larger than 2.6 m at one side, or even as large as about 3 m or greater (e.g. about 3.3 m or greater) at one side are used.

The materials forming the respective layers in the Low-E layer include $TiO_2$, $ZrO_2$, $Si_xN_y$, $ZnO_x$, Ag, $NiCrO_x$, $SnO_2$ and ZTO (oxide of zinc and tin). As an infrared-reflective layer, a Ag layer is preferably used. The Ag layer can be formed of Ag alone or an alloy of Ag and other metal (Pd, etc.). Low-E layer 120 in this embodiment includes a zinc oxide layer. While no particular limitations are imposed, in the Low-E layer according to some embodiments, the Ag layer can be present between any two of oxide layers such as $TiO_2$ layers, $ZrO_2$ layers, $ZnO_x$ layers, $NiCrO_x$ layers, $SnO_2$ layers and ZTO layers or nitride layers such as $Si_xN_y$ layers. The material of the Low-E layer's outermost surface (to which the protective sheet is applied) is often an oxide such as $TiO_2$, $ZrO_2$, $ZnO_x$, $NiCrO_x$, $SnO_2$ and ZTO or a nitride such as $Si_xN_y$; it typically is not a metal such as Ag. Depending on the purpose and required properties, the Low-E layer may have a multi-layer structure with 5 or more layers, for instance, 10 or more layers, or even 15 or more layers. The thickness of each layer is not particularly limited. It is usually 1000 Å or less, or suitably about 10 Å to 700 Å, for instance, about 30 Å to 300 Å. The thickness (overall thickness) of the Low-E layer can be about 10 nm to 1000 nm (e.g. about 50 nm to 500 nm). The Low-E glass plate can be a generally available product or modified product thereof including commercial products, or can be prepared by a known or conventional method.

In the step (B), as shown in FIG. 1, a protective sheet 200 is applied to the surface of Low-E layer 120 formed on glass substrate 110 (S20). Protective sheet 200 is typically applied to the surface in a removable manner. Here, "(to be) applied in a removable manner" means adhesion whose eventual release is intended or expected; in many cases, it refers to adhesion such that the adherend can maintain its pre-adhesion surface condition basically intact after the protective sheet (PSA sheet) is removed. In particular, protective sheet 200 is applied to Low-E glass plate 100 by adhering the PSA layer surface of protective sheet 200 to the surface of Low-E layer 120 of Low-E glass plate 100. By this, the surface of Low-E glass plate 100 is protected with protective sheet 200. From the standpoint of the protection, the size of protective sheet 200 is preferably about the same as the surface of Low-E layer 120. Two or more protective sheets may be partially layered to cover the surface to be protected. By covering the surface of Low-E layer 120 with protective sheet 200, the Low-E layer 120 can be prevented or inhibited from alteration.

Figure 1C:
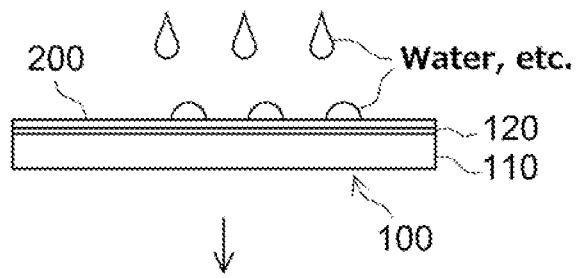
Figure 1D:
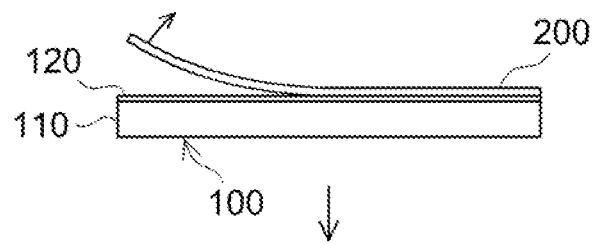

After the step (B), as the step (C), with respect to the Low-E glass plate 100 having the protective sheet 200 applied thereon, at least one process may be optionally carried out, selected from the group consisting of transportation, storage, processing, washing and handling (S30). The processing may be the sort of cutting and edge seaming of the Low-E glass plate 100 having the protective sheet 200 applied thereon. The cutting means and the cut size are suitably selected in accordance with the purpose and are not particularly limited. The protective sheet 200 may be left on the surface of Low-E layer 120 even after the Low-E glass plate 100 is cut. The cut Low-E glass plate 100 is typically washed with water, etc. In the washing step, in addition to the water, a detergent (including surfactant) may be optionally used. During the transportation, storage, processing such as cutting, washing such as a water wash and various kinds of handling, as shown in FIG. 1(C), by the presence of protective sheet 200 thereon, the Low-E layer 120 is protected from damage, wearing and alteration.

Figure 1E:
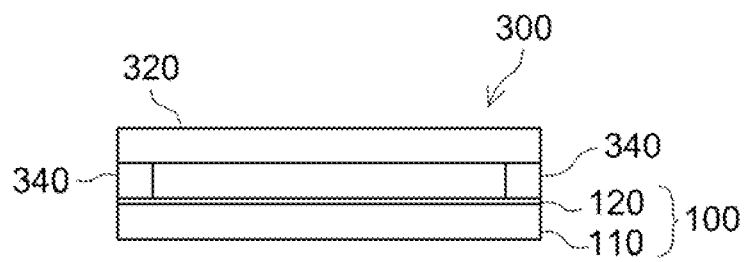

Subsequently, in the step (D), protective sheet 200 is removed from Low-E glass plate 100 (S40). The protective sheet 200 is removed from Low-E glass plate 100 (adherend) after achieving the protection purpose. Low-E glass plate 100 from which protective sheet 200 is removed is usually heated and annealed in an oven. Subsequently, as shown in FIG. 1(E), using the Low-E glass plate 100, a glass unit 300 is fabricated (S50). Glass unit 300 is typically a heat-blocking or thermally-insulating glass unit, which can be fabricated by obtaining a pair of glass plates of which at least one is a Low-E glass plate and assembling a pair-glass (e.g. dual-pane glass) with the surface of Low-E layer 120 of Low-E glass plate 100 on the inside. Numbers 320 and 340 in FIG. 1(E) represent another glass plate forming the glass unit 300 and a spacer, respectively. Spacer 340 is placed between Low-E glass plate 100 and another glass plate 320 to create an open space between glass plates 100 and 320. In the method disclosed herein, in addition to the protective sheet, known or conventionally-used powder or coating liquid may be used together.

The embodiment has been illustrated with an example of a Low-E glass plate having a zinc oxide-containing Low-E layer; however, the Low-E glass plate is not limited to those having zinc oxide-containing Low-E layers. The Low-E layer alteration prevented or inhibited by the art disclosed herein is attributed to alteration of the zinc component in the Low-E layer. Thus, the Low-E layer used in this art is not particularly limited as long as it comprises a zinc component.

The Low-E layer of the Low-E glass plate disclosed herein may typically has one, two or more zinc-containing layers. One zinc-containing layer has a thickness of, for instance, about 100 nm or less, or suitably about 70 nm or less (e.g. about 30 nm or less) and, for instance, about 1 nm or greater, or suitably about 3 nm or greater (e.g. about 8 nm or greater). Typical examples of the zinc-containing layer include a zinc oxide-containing layer. The zinc oxide-containing layer may be formed of zinc oxide or an oxide of zinc and other element (e.g. tin).

The zinc-containing layer may be present on the outer surface (outermost surface) or may be present inside the Low-E layer. In an embodiment where the zinc-containing layer is present inside the Low-E layer, the distance (thickness) from the Low-E layer's outer surface to the zinc-containing layer is not particularly limited. It is, for instance, about 300 nm or less, or suitably about 200 nm or less (e.g. about 100 nm or less). In such an embodiment, the effect of the art disclosed herein can be preferably obtained. The minimum distance (thickness) from the Low-E layer's outer surface to the zinc-containing layer is not particularly limited. It can be, for instance, about 1 nm or greater, or even about 10 nm or greater.

<Protection Method>

The protection method disclosed herein uses the protective sheet (or surface protective sheet) disclosed herein. It is typically a method for partially or entirely protecting the surface of a Low-E glass plate. The protection method disclosed herein is characterized by comprising a step of applying the protective sheet to the surface of the Low-E glass plate (an application step).

The protection method disclosed herein may further comprise a step of removing the protective sheet from the Low-E glass plate (a removal step). Between the application step and the removal step, for the article having the protective sheet applied thereon, the method may optionally include at least one process selected from the group consisting of transporting, storing, processing, washing and handling.

A favorable example of the protection method disclosed herein is as described earlier regarding the glass unit production method; the application step and the removal step of this protection method correspond to the steps (B) and (D) in the production method, respectively. Other matters in the protection method are not particularly limited. They can be understood by an ordinarily-skilled person in consideration of the description of the glass unit production method. Thus, details are omitted here.

<Constitution of Protective Sheet>

Figure 2:
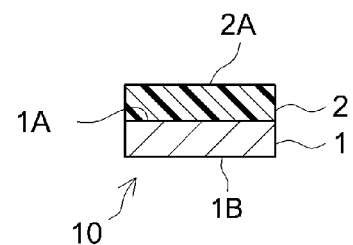
FIG. 2 shows a cross-sectional diagram schematically illustrating an embodiment of the protective sheet.

The protective sheet disclosed herein typically has a PSA layer on a substrate layer (support substrate or simply a "substrate"; the same applies hereinafter). FIG. 2 shows a cross-sectional structure of the protective sheet according to an embodiment. Protective sheet 10 comprises a PSA layer 2 provided on the first face 1A of a substrate-layer sheet 1. When used, it is applied to an adherend (article to be protected) over the face 2A of PSA layer 2. The back face 1B (on the reverse side of the first face 1A) of substrate layer 1 is also the back face of protective sheet 10, forming the outer surface of protective sheet 10. Prior to use (i.e. before applied to the adherend), protective sheet 10 can be in a form where the face 2A (adhesive face, i.e. the bonding surface to the adherend) of PSA layer 2 is protected with a release liner (not shown in the drawing) having a release face at least on the PSA layer side. Alternatively, protective sheet 10 may be in a form where, with the second surface (back face) 1B of substrate layer 1 being a release face, protective sheet 10 is wound in a roll so that the back face comes in contact with the PSA layer 2 to protect the surface (adhesive face) 2A. The protective sheet may have a PSA layer on each face of the substrate layer.

As the release liner, commonly-used release paper and the like can be used without particular limitations. For instance, a release liner having a release layer on a surface of a liner substrate such as plastic film and paper, a release liner formed from a low-adhesive material such as fluorinated polymer (polytetrafluoroethylene, etc.) and polyolefinic resin, and the like can be used. The release layer can be formed by subjecting the liner substrate to surface treatment with various release agents including silicone-based, long-chain alkyl-based, and fluorinated kinds as well as molybdenum sulfide.

The protective sheet disclosed herein is not particularly limited in width. For instance, by using a protective sheet having a width of about 1 m or greater or even about 1.5 m or greater, a Low-E glass plate having a relatively large surface area can be efficiently protected. In some preferable embodiments, the protective sheet has a width of about 2 m or greater. With such a broad protective sheet, a large Low-E glass plate can be protected with a single sheet or a few sheets. For protecting the Low-E glass plate, it is preferable to use a protective sheet having a width of, for instance, about 2.5 m or greater, or even about 2.6 m or greater. The protective sheet's width can be greater than 2.6 m (e.g. 3 m or greater, or even about 3.3 m or greater). The maximum width of the protective sheet is not particularly limited. From the standpoint of the productivity, handling properties, etc., it is suitably about 5 m or less, for instance, possibly about 4 m or less.

The protective sheet disclosed herein can be specified by the plane (sheet face) having a long side and a short side. The long side is defined longer than the short side and the short side is defined shorter than the long side. For instance, the short side may orthogonally intersect the long side. The protective sheet's length direction coincides with the long side and the width direction orthogonally intersects the length direction. Accordingly, as used herein, the "width" is defined as the length (distance) in the direction orthogonal to the length direction. Long-length, belt-like and oblong protective sheets are typical examples of the protective sheet disclosed herein. While the long side extends almost linearly, the short side is not limited to a straight line and can be a curve, zigzag, etc. For instance, in a long protective sheet, the length (distance in the length direction) is equal to or greater than the width.

The thickness of the protective sheet disclosed herein is not particularly limited. From the standpoint of the handling properties, the lightness of weight, etc., it is suitably about 1000 μm or less (typically about 300 μm or less, e.g. about 150 μm or less). In some embodiments, the thickness of the protective sheet is preferably about 120 μm or less, more preferably about 100 μm or less, yet more preferably about 75 μm or less, or possibly, for instance, less than 60 μm. The thickness of the protective sheet can be typically greater than 20 μm, preferably greater than 30 μm, or more preferably greater than 40 μm, for instance, greater than 45 μm.

As used herein, the thickness of the protective sheet includes the thicknesses of the PSA layer and the substrate layer, but excludes the thickness of the release liner.

<PSA Layer>

(Ammonia Content)

The PSA layer constituting the protective sheet disclosed herein is characterized by having less than 850 μg ammonia per gram of PSA (layer), determined by hot water extraction. In other words, the ammonia content of the PSA layer is less than 850 μg per gram of PSA layer weight. This can prevent or inhibit alteration in the protected Low-E glass plate.

The mechanism of preventing or inhibiting Low-E layer alteration by limiting the ammonia content of PSA is described in detail below; however, the art disclosed herein is not limited to the particulars below. The present inventors had found that the PSA under study for use in protection of Low-E glass plates had caused alteration to the Low-E layers after applied to their surface. Accordingly, study had been conducted in two directions, namely on identifying altered locations in the Low-E layers and on identifying causative agents. With respect to the altered locations in the Low-E layers, cross sections of Low-E layer specimens were adjusted by an FIB (focused ion beam) microsampling method; using a field emission transmission electron microscope (FE-TEM; model JEM-2800 available from JEOL Ltd.), FE-TEM analysis was conducted on the specimens at an accelerating voltage of 200 kV further, using an energy dispersive X-ray spectroscopy (EDX) analyzer (product name NORAN System 7 available from Thermo Fisher Scientific Inc.), EDX elemental analysis was conducted on the specimens; and the results have shown changes (specifically, decreases in density) in zinc-containing layers and decreases in peak intensity of the zinc in the zinc-containing layers. On the other hand, with respect to identifying the causative agents, PSA components (polymer, crosslinking agent, emulsifier, etc.) were separately brought in contact with surfaces of Low-E layers in Low-E glass plates and samples sealed with glass covers were prepared; and the samples were stored as they were and then observed. The results have identified that ammonia used as a pH-adjusting agent is a causative agent of alteration to Low-E layers. In other words, it has been determined that ammonia in PSA permeates Low-E layers and acts to dissolve the zinc component, thereby causing alteration to Low-E layers. It is thought that this phenomenon is caused by the reaction between the zinc component and ammonia. Based on this knowledge, in the art disclosed herein, the ammonia content of PSA in the Low-E glass plate protective sheet is limited to below the prescribed value. When the amount of ammonia which is a causative agent of Low-E layer alteration is limited to below the prescribed value, alteration of Low-E layers can be prevented or inhibited in Low-E glass plates.

From the standpoint of preventing alteration of Low-E layers, the ammonia content per gram of PSA (layer) is preferably less than 750 μg, more preferably less than 650 μg, yet more preferably less than 550 μg, particularly preferably about less than 450 μg (e.g. less than 400 μg), possibly less than 300 μg or even less than 100 μg (e.g. less than 10 μg). The PSA layer according to some embodiments may be essentially free of ammonia. The minimum ammonia content per gram of PSA (layer) is 0 μg; however, in view of the convenience of ammonia for pH adjustment and other purposes, it can be about 1 μg or greater, about 10 μg or greater, or even about 100 μg or greater. From the standpoint of the PSA composition's applicability and stability, the ammonia content per gram of PSA (layer) can be about 300 μg or greater, about 500 μg or greater, or even about 700 μg or greater (e.g. about 800 μg or greater). The amount of ammonia in the PSA layer can be adjusted through the amount of ammonia added to the PSA composition, drying conditions, etc. The ammonia content per gram of PSA (layer) is determined by the method described later in Examples. Alternatively, it can be determined as follows: the protective sheet and the substrate layer constituting the protective sheet are measured for ammonia content by hot water extraction; from their difference in ammonia content, the ammonia content of the PSA layer is determined; and the resulting value is converted to the value per unit PSA (layer).

The type of PSA forming the PSA layer disclosed herein is not particularly limited. The PSA layer may be formed from a PSA composition comprising, as the base polymer (the primary component among the polymers, i.e. a component accounting for 50% by weight or more), one, two or more species selected among various polymers (polymers as adhesive components or adhesive polymers), such as acrylic, polyester-based, urethane-based, polyether-based, rubber-based, silicone-based, polyamide-based, and fluorinated polymers. The art disclosed herein can be preferably made, for instance, as a protective sheet comprising an acrylic PSA layer or a rubber-based PSA layer.

The "acrylic PSA layer" here refers to a PSA layer comprising an acrylic polymer as the base polymer. Similarly, the "rubber-based PSA layer" refers to a PSA layer comprising a rubber-based polymer as the base polymer. The "acrylic polymer" refers to a polymer whose primary monomer (the primary component among the monomers, i.e. a component that accounts for 50% by weight or more of the total amount of the monomers forming the acrylic polymer) is a monomer having at least one (meth)acryloyl group per molecule. Such a monomer may be referred to as an "acrylic monomer" hereinafter. As used herein, the "(meth)acryloyl group" comprehensively refers to acryloyl group and methacryloyl group. Similarly, the "(meth)acrylate" comprehensively refers to acrylate and methacrylate.

(Acrylic Polymer)

A preferable example of the acrylic polymer is a polymer of a starting monomer mixture that comprises an alkyl (meth)acrylate (or a monomer A hereinafter) and may further comprise another monomer (or a monomer B hereinafter) that is copolymerizable with the alkyl (meth)acrylate. The acrylic polymer typically has a monomer unit composition corresponding to the monomer composition of the starting monomer mixture.

A preferable monomer A is an alkyl (meth)acrylate represented by the next general formula (1):

$$CH_2=C(R^1)COOR^2 \qquad (1)$$

Here, $R^1$ in the formula (1) is a hydrogen atom or a methyl group. $R^2$ is an alkyl group having 1 to 20 carbon atoms. Hereinafter, such a range of the number of carbon atoms may be indicated as "$C_{1-20}$." From the standpoint of the polymerization reactivity, polymerization stability, etc., an alkyl (meth)acrylate wherein $R^2$ is a $C_{1-16}$ alkyl group is preferable, and an alkyl (meth)acrylate wherein $R^2$ is a $C_{1-12}$ (typically $C_{1-10}$, e.g. $C_{1-8}$) alkyl group is more preferable.

Examples of an alkyl (meth)acrylate with $R^2$ being a $C_{1-20}$ alkyl group include methyl (meth)acrylate, ethyl (meth)acrylate, propyl (meth)acrylate, isopropyl (meth)acrylate, n-butyl (meth)acrylate, isobutyl (meth)acrylate, s-butyl (meth)acrylate, t-butyl (meth)acrylate, pentyl (meth)acrylate, isopentyl (meth)acrylate, hexyl (meth)acrylate, heptyl (meth)acrylate, 2-ethylhexyl (meth)acrylate, n-octyl (meth)acrylate, isooctyl (meth)acrylate, n-nonyl (meth)acrylate, isononyl (meth)acrylate, n-decyl (meth)acrylate, isodecyl (meth)acrylate, undecyl (meth)acrylate, lauryl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, eicosyl (meth)acrylate, etc. These alkyl (meth)acrylates can be used solely as one species or in a combination of two or more species.

The art disclosed herein can be preferably implemented in an embodiment where the alkyl acrylate as the monomer A accounts for about 50% by weight or more (more preferably about 75% by weight or more, yet more preferably about 90% by weight or more, e.g. about 95% by weight or more) of the total monomer content. As the alkyl acrylate, an alkyl acrylate with $R^2$ in the formula (1) being a $C_{1-20}$ alkyl group is preferable and an alkyl acrylate with $R^2$ being a $C_{1-12}$ (more preferably $C_{1-10}$, particularly preferably $C_{1-8}$) alkyl group is more preferable. The art disclosed herein can also be preferably implemented in an embodiment where the alkyl acrylate has a $C_{2-8}$ (typically $C_{4-8}$) alkyl group for $R^2$ in the formula (1). For the alkyl acrylate, solely one species or a combination of two or more species can be used. When two or more species of alkyl acrylate are used, to adjust the acrylic polymer's Tg to the most adequate range, etc., an alkyl acrylate A1 with $R^2$ being a $C_{4-20}$ (more preferably $C_{4-10}$, or yet more preferably $C_{4-8}$) alkyl group and an alkyl acrylate A2 with $R^2$ being a $C_{1-3}$ (more preferably $C_{1-2}$, e.g. $C_2$) alkyl group can be used together. In this embodiment, the alkyl acrylate A1 to alkyl acrylate A2 weight ratio (A1:A2) is not particularly limited. For instance, it is about 5:95 to 95:5, or suitably about 10:90 to 90:10, for instance, about 15:85 to 85:15.

In some preferable embodiments, the monomers include one, two or more species of alkyl methacrylate as the monomer A. With the use of the alkyl methacrylate, the base polymer can be preferably designed so as to achieve desirable adhesive properties. As the alkyl methacrylate, an alkyl methacrylate with $R^2$ in the formula (1) being a $C_{1-10}$ alkyl group is preferable and an alkyl methacrylate with $R^2$ being a $C_{1-4}$ (more preferably $C_1$ or $C_{2-4}$) alkyl group is more preferable. The alkyl methacrylate can be preferably used in combination with an alkyl acrylate. When an alkyl methacrylate and an alkyl acrylate are used together, with one, two or more species of alkyl methacrylate (e.g. $C_{2-4}$ alkyl methacrylate) having a weight CA and one, two or more species of alkyl acrylate having a weight CA, their ratio ($C_{AM}$:$C_{AA}$) is not particularly limited. In some embodiments, it is about 1:9 to 9:1, suitably about 2:8 to 8:2, preferably about 3:7 to 7:3, or more preferably about 4:6 to 6:4. In other embodiments, the ratio of the weight CA of the alkyl methacrylate (e.g. $C_1$ alkyl methacrylate, i.e. methyl methacrylate (MMA)) in the total amount ($C_{AM}$+$C_{AA}$) of the alkyl (meth)acrylate is about 30% by weight or lower, suitably about 20% by weight or lower, preferably about 10% by weight or lower, or more preferably about 7% by weight or lower. On the other hand, the lower limit is, for instance, about 0.1% by weight or higher, suitably about 1% by weight or higher, or preferably about 2% by weight or higher (e.g. about 3% by weight or higher).

The art disclosed herein can be implemented in an embodiment where the monomers are essentially free of an alkyl methacrylate as the monomer A. In an embodiment using an alkyl methacrylate, it can be implemented, for instance, in an embodiment free of a $C_{1-3}$ alkyl methacrylate (typically MMA).

In another preferable embodiment, the acrylic polymer is a polymer of a starting monomer mixture that comprises an alkyl acrylate (or a monomer $m_A$, hereinafter) having 4 to 9 alkyl carbon atoms and may further comprise other monomer(s) as necessary. The acrylic polymer can be synthesized by polymerizing a starting monomer mixture having the corresponding composition (monomer composition) by a known method.

Non-limiting examples of monomer ma include n-butyl acrylate (BA), n-hexyl acrylate, 2-ethylhexyl acrylate (2EHA), n-octyl acrylate, n-nonyl acrylate and isononyl acrylate (iNA). A preferable alkyl acrylate includes a —$(CH_2)_3$— structure in the alkyl group and a more preferable alkyl acrylate includes a —$(CH_2)_4$— structure in the alkyl group. Favorable examples of monomer $m_A$ include 2EHA, BA and iNA. For the monomer $m_A$, solely one species or a combination of two or more species can be used.

The amount of monomer $m_A$ used typically accounts for 40% by weight or more of the starting monomers used in the synthesis of acrylic polymer. From the standpoint of the flexibility and enhanced low-temperature properties of the PSA layer comprising the acrylic polymer, it is advantageous that the monomer composition includes at least 40% monomer $m_A$ by weight. From such a standpoint, the ratio of monomer $m_A$ is preferably 45% by weight or higher, or possibly 50% by weight or higher (e.g. above 50% by weight). When the monomer composition includes 99.9% or less monomer $m_A$ by weight, the PSA layer comprising the acrylic polymer is likely to have suitable cohesion. From such a standpoint, the ratio of monomer $m_A$ is preferably 95% by weight or lower, more preferably 90% by weight or lower, or possibly 85% by weight or lower. In some embodiments, the ratio of monomer $m_A$ can be below 80% by weight or even below 70% by weight (e.g. 65% by weight or lower).

The acrylic polymer in the art disclosed herein may have a monomer composition comprising a carboxy group-containing monomer (or a monomer $m_B$, hereinafter) as the monomer B. In other words, a monomer $m_B$ may be copolymerized in the acrylic polymer. The monomer $m_B$ may be useful in introducing crosslinking points into the acrylic polymer and increasing the cohesive strength of the PSA layer comprising the acrylic polymer. The monomer $m_B$ may help enhance the anti-PSA-residue properties by increasing the tightness of adhesion (anchoring) between the acrylic polymer-containing PSA layer and the substrate layer. Examples of the carboxy group-containing monomer include ethylenically unsaturated monocarboxylic acids such as acrylic acid, methacrylic acid, crotonic acid, isocrotonic acid, carboxyethyl (meth)acrylate, carboxypentyl (meth)acrylate and 1-[2-(methacryloyloxy)ethyl] succinate; ethylenically unsaturated dicarboxylic acids such as maleic acid, fumaric acid, itaconic acid and citraconic acid, and anhydrides thereof (e.g. maleic anhydride, itaconic anhydride, etc.). These carboxy group-containing monomers can be used singly as one species or in a combination of two species.

When using a monomer $m_B$, the ratio of monomer $m_B$ in the monomer composition is not particularly limited. The ratio of monomer $m_B$ can be, for instance, 0.05% by weight or higher, or suitably 0.1% by weight or higher. From the standpoint of the polymerization stability and dispersion stability, it is preferably 0.5% by weight or higher, or more preferably 1% by weight or higher. From the standpoint of inhibiting an excessive increase in peel strength (adhesive strength), the ratio of monomer $m_B$ is suitably about 20% by weight or lower (preferably about 10% by weight or lower, typically about 7% by weight or lower), more preferably about 5% by weight or lower, or yet more preferably about 4% by weight or lower (e.g. 3% by weight or lower). From the standpoint of inhibiting erosion of the Low-E glass plate as the object to be protected, it is preferable to limit the amount of carboxy group-containing monomer used.

In the acrylic polymer in the art disclosed herein, for purposes such as adjusting the glass transition temperature (Tg) of the acrylic polymer, an alkyl (meth)acrylate (or a monomer $m_C$, hereinafter) may be copolymerized as the monomer A, the alkyl (meth)acrylate having 4 to 20 alkyl carbon atoms and having a homopolymer Tg of −50° C. or higher. Here, a monomer belonging to the monomer $m_A$ is not categorized as a monomer $m_C$. For the monomer $m_C$, solely one species or a combination of two or more species can be used. A preferable monomer $m_C$ has a homopolymer Tg in the range between −40° C. and +60° C. and a more preferable monomer me in the range between −30° C. and +40° C. (e.g. between −20° C. and +30° C.). Non-limiting examples of a monomer $m_C$ that can be preferably used include n-butyl methacrylate (BMA), 2-ethylhexyl methacrylate and lauryl acrylate.

When using a monomer $m_C$, the ratio of monomer me in the monomer composition is not particularly limited. The ratio of monomer me can be, for instance, 1% by weight or higher, 5% by weight or higher, 10% by weight or higher, or even 15% by weight or higher. In an embodiment, from the standpoint of obtaining greater effect of monomer $m_C$, the ratio of monomer me in the monomer composition can also be 20% by weight or higher, 25% by weight or higher, 30% by weight or higher, or even 35% by weight or higher (e.g. 40% by weight or higher). The ratio of monomer me in the monomer composition can be below 60% by weight. From the standpoint of the flexibility and enhanced low-temperature properties, it is suitably about 55% by weight or lower (typically about 50% by weight or lower, e.g. about 45% by weight or lower). In some embodiments, the ratio of monomer me can be below 30% by weight, below 20% by weight, or even below 10% by weight (e.g. below 5% by weight, or even below 1% by weight).

In the acrylic polymer in the art disclosed herein, as necessary, other monomer(s) (monomer $m_D$) can be copolymerized as the monomer A besides monomers $m_A$, $m_B$ and $m_C$. As the monomer $m_D$, among various monomers copolymerizable with monomer $m_A$, solely one species or a combination of two or more species can be used.

As the monomer $m_D$, for instance, it is possible to use an alkyl (meth)acrylate (monomer $m_{D1}$) represented by the formula (1) shown earlier (while excluding any species considered a monomer $m_A$ or monomer $m_C$). Specific examples of the alkyl (meth)acrylate that can be used as monomer $m_{D1}$ include methyl (meth)acrylate, ethyl (meth)acrylate, propyl (meth)acrylate and the like. For the monomer $m_{D1}$, solely one species or a combination of two or more species can be used.

Examples of compounds that can be used as the monomer $m_D$ may include a functional group-containing monomer (monomer B) such as those described below. These functional group-containing monomers may be useful for introducing crosslinking points into the acrylic polymer or for increasing the cohesive strength of the acrylic polymer.

Hydroxy group-containing monomers: e.g. hydroxyalkyl (meth)acrylates such as 2-hydroxyethyl (meth)acrylate, 2-hydroxypropyl (meth)acrylate, 3-hydroxypropyl (meth)acrylate, 2-hydroxybutyl (meth)acrylate, 4-hydroxybutyl (meth)acrylate, 6-hydroxyhexyl (meth) acrylate, 8-hydroxyoctyl (meth)acrylate, 10-hydroxydecyl (meth)acrylate, 12-hydroxyauryl (meth)acrylate and (4-hydroxymethylcyclohexyl)methyl acrylate; unsaturated alcohols such as vinyl alcohol and allyl alcohol.

Amide group-containing monomers: e.g. (meth)acrylamide, N,N-dimethyl (meth)acrylamide, N,N-diethyl (meth)acrylamide, N,N-dimethylaminopropyl (meth) acrylamide, N-butyl (meth)acrylamide, N-methylol (meth)acrylamide, N-methylolpropane (meth)acrylamide, N-methoxymethyl (meth)acrylamide, N-butoxymethyl (meth)acrylamide and diacetone (meth)acrylamide;

Imide group-containing monomers: e.g. N-isopropylmaleimide, N-cyclohexylmaleimide, itaconimide;

Amino group-containing monomers: e.g. aminoethyl (meth)acrylate, N,N-dimethylaminoethyl (meth)acrylate, N,N-dimethylaminopropyl (meth)acrylate, t-butylaminoethyl (meth)acrylate;

Epoxy group-containing monomers: e.g. glycidyl (meth) acrylate, methylglycidyl (meth)acrylate, allyl glycidyl ether;

Cyano group-containing monomers: e.g. acrylonitrile, methacrylonitrile;

Keto group-containing monomers: e.g. diacetone (meth) acrylamide, diacetone (meth)acrylate, vinyl methyl ketone, vinyl ethyl ketone, allyl acetoacetate, vinyl acetoacetate;

Monomers having nitrogen atom-containing rings: e.g. N-vinyl-2-pyrrolidone, N-methylvinylpyrrolidone, N-vinylpyridine, N-vinylpiperidone, N-vinylpyrimidine, N-vinylpiperazine, N-vinylpyrazine, N-vinylpyrrole, N-vinylimidazole, N-vinyloxazole, N-vinylmorpholine, N-vinylcaprolactam, N-(meth)acryloyl morpholine, N-(meth)acryloylpyrrolidone;

Alkoxysilyl group-containing monomers: e.g. (3-(meth) acryloxypropyl)trimethoxysilane, (3-(meth)acryloxypropyl)triethoxysilane, (3-(meth)acryloxypropyl)methyldimethoxysilane, (3-(meth)acryloxypropyl) methyldiethoxysilane.

Other examples of the compound that can be used as the monomer $m_D$ include vinyl ester-based monomers such as vinyl acetate and vinyl propionate; aromatic vinyl compounds such as styrene, substituted styrenes (α-methylstyrene, etc.) and vinyltoluene; non-aromatic ring-containing (meth)acrylates such as cyclohexyl (meth)acrylate, t-butylcyclohexyl (meth)acrylate, cyclopentyl di(meth)acrylate and isobornyl (meth)acrylate; aromatic ring-containing (meth) acrylates such as aryl (meth)acrylates (e.g. phenyl (meth) acrylate, benzyl (meth)acrylate), aryloxyalkyl (meth)acrylate (e.g. phenoxyethyl (meth)acrylate), arylalkyl (meth) acrylate (e.g. benzyl (meth)acrylate); olefinic monomers such as ethylene, propylene, isoprene, butadiene and isobutylene; chlorine-containing monomers such as vinyl chloride and vinylidene chloride; isocyanate group-containing monomers such as 2-(meth)acryloxyethylisocyanate; alkoxy group-containing monomers such as methoxymethyl (meth)acrylate and ethoxyethyl (meth)acrylate; vinyl ether-based monomers such as methyl vinyl ether, ethyl vinyl ether and isobutyl vinyl ether.

Yet other examples of the compound that can be used as the monomer $m_D$ include polyfunctional monomers. Specific examples of polyfunctional monomers include compounds having two or more (meth)acryloyl groups per molecule such as 1,6-hexanediol di(meth)acrylate, ethylene glycol di(meth)acrylate, pentaerythritol di(meth)acrylate, trimethylolpropane tri(meth)acrylate, dipentaerythritol hexa (meth)acrylate and methylene bisacrylamide. When using such a polyfunctional monomer, its amount used is not particularly limited. It is suitably 2% by weight or less (more preferably 1% by weight or less) of the total monomer content.

The monomer $m_D$ is used in an amount of typically no more than 40% by weight of the monomer composition, preferably no more than 20% by weight, or more preferably no more than 10% by weight. The monomer $m_D$ may not be used. The art disclosed herein can be preferably practiced in an embodiment where the amount of monomer $m_D$ used is 0% or more and below 5% by weight of the monomer composition. Here, that the amount of monomer $m_D$ used is 0% by weight means that no monomer $m_D$ is used at least intentionally.

The ratio of monomer A (alkyl (meth)acrylate) in the total monomer content can be, but is not particularly limited to, for instance, about 50% by weight or greater; it is suitably about 60% by weight or greater, preferably about 70% by weight or greater, more preferably about 80% by weight or greater, or yet more preferably about 85% by weight or greater. With the inclusion of the monomer A in a prescribed amount, a protective sheet having desirable adhesive properties can be favorably obtained. The art disclosed herein can be preferably implemented, for instance, in an embodiment where the monomer A content in the total monomer content is about 90% by weight or greater. In an embodiment, the monomer A content can be about 95% by weight or greater, or even about 97% by weight or greater. The PSA composition comprising such an acrylic polymer as the base polymer can be advantageous from the standpoint of the weatherability of the PSA layer formed therefrom (and also the protective sheet having the PSA layer). In an embodiment using a monomer A and a monomer B together, from the standpoint of suitably obtaining the effects of the monomer B, the monomer A content in the total monomer content can be, for instance, 99.9% by weight or less; it is preferably 99.5% by weight or less, more preferably 99% by weight or less, or about 97% by weight or less (e.g. 95% by weight or less).

When an aforementioned functional group-containing monomer is copolymerized in the acrylic polymer, the ratio of the functional group-containing monomer to all the monomers forming the acrylic polymer is preferably about 0.1% by weight or higher (typically about 0.5% by weight or higher, e.g. about 1% by weight or higher), and preferably about 40% by weight or lower (typically about 30% by weight or lower, e.g. about 20% by weight or lower). When a hydroxy group-containing monomer is copolymerized with the acrylic monomer, from the standpoint of obtaining desirable cohesive strength, the ratio of hydroxy group-containing monomers to the total monomer content is suitably about 0.001% by weight or higher (typically about 0.01% by weight or higher, e.g. about 0.1% by weight or higher), preferably about 1% by weight or higher, or more preferably about 3% by weight or higher; it is preferably about 10% by weight or lower (typically about 7% by weight or lower, e.g. about 5% by weight or lower).

(Rubber-Based Polymer) In another preferable embodiment, the PSA layer can be a rubber-based PSA layer. Examples of the base polymer include natural rubber; styrene-butadiene rubber (SBR); polyisoprene; butene-based polymer comprising a butene (1-butene or cis- or trans-2-butene) and/or 2-methylpropene (isobutylene) as the primary monomer(s); A-B-A block copolymer rubber and a hydrogenation product thereof, e.g. styrene-butadiene-styrene block copolymer rubber (SBS), styrene-isoprene-styrene block copolymer (SIS), styrene-isobutylene-styrene block copolymer rubber (SIBS), styrene-vinyl-isoprene-styrene block copolymers (SVIS), hydrogenated SBS (styrene-ethylene/butylene-styrene block copolymer (SEBS)), and hydrogenated SIS (styrene-ethylene-propylene-styrene block copolymers (SEPS)). These rubber-based polymers can be used singly as one species or in a combination of two or more species.

(Tg of Base Polymer)

The Tg value of the PSA layer's base polymer (an acrylic polymer in case of an acrylic PSA layer being used) is not particularly limited in Tg. The Tg of the base polymer can be, for instance, about 0° C. or lower. In a preferable embodiment, the base polymer of the PSA layer has a Tg of about −5° C. or lower. According to a base polymer having such a Tg, a PSA layer that tightly adheres to adherend can be favorably formed. In an embodiment where the base polymer has a Tg of about −15° C. or lower (more preferably about −20° C. or lower, e.g. about −25° C. or lower), greater effects can be obtained. In other preferable embodiments, from the standpoint of the adhesion to adherends, the base polymer of the PSA layer has a Tg of about −35° C. or lower, more preferably about −40° C. or lower, or yet more preferably about −45° C. or lower (e.g. below −50° C., even about −52° C. or lower, or about −55° C. or lower). The Tg of the base polymer is suitably −70° C. or higher. From the standpoint of the cohesion of the PSA, etc., it is preferably about −65° C. or higher, more preferably −60° C. or higher, yet more preferably about −55° C. or higher (e.g. about −50° C. or higher), or possibly even about −35° C. or higher.

The base polymer's Tg can be adjusted by suitably changing the monomer composition (i.e. the monomer species used in the synthesis of the polymer and their ratio).

In the present description, the Tg of a polymer refers to the value determined by the Fox equation based on the Tg values of homopolymers of the respective monomers forming the polymer and the weight fractions (copolymerization ratio by weight) of the monomers. As shown below, the Fox equation is a relational expression between the Tg of a copolymer and glass transition temperatures Tgi of homopolymers of the respective monomers constituting the copolymer.

$$1/Tg = \Sigma(Wi/Tgi)$$

In the Fox equation, Tg represents the glass transition temperature (unit: K) of the copolymer, Wi the weight fraction (copolymerization ratio by weight) of a monomer i in the copolymer, and Tgi the glass transition temperature (unit: K) of homopolymer of the monomer i.

For the glass transition temperatures of homopolymers used for determining the Tg, the values found in known documents are used. For instance, with respect to the monomers listed below, for the glass transition temperatures of their homopolymers, the following values are used:

| | |
|---|---|
| 2-ethylhexyl acrylate | −70° C. |
| n-hexyl acrylate | −65° C. |
| n-octylacrylate | −65° C. |
| isononyl acrylate | −60° C. |
| n-nonyl acrylate | −58° C. |
| n-butyl acrylate | −55° C. |
| ethyl acrylate | −20° C. |
| lauryl acrylate | 0° C. |
| 2-ethylhexyl methacrylate | −10° C. |
| methyl acrylate | 8° C. |
| n-butyl methacrylate | 20° C. |
| methyl methacrylate | 105° C. |
| acrylic acid | 106° C. |
| methacrylic acid | 228° C. |
| vinyl acetate | 32° C. |
| styrene | 100° C. |

With respect to the Tg values of homopolymers other than the examples listed above, the values given in *Polymer Handbook* (3rd edition, John Wiley & Sons, Inc., Year 1989) are used. With respect to a monomer for which two or more values are listed in the *Polymer Handbook*, the highest value is used. When no values are given in the *Polymer Handbook*, values obtained by the measurement method described in Japanese Patent Application Publication No. 2007-51271 are used.

((Synthesis of Base Polymer)

The method for obtaining the base polymer (e.g. an acrylic polymer) is not particularly limited. Known polymerization methods can be suitably employed, such as solution polymerization, emulsion polymerization, bulk polymerization, and suspension polymerization. Alternatively, it is also possible to employ photopolymerization involving irradiation of light such as UV (typically carried out in the presence of a photopolymerization initiator) and active energy ray irradiation polymerization such as radiation polymerization involving irradiation of radioactive rays such as β rays and γ rays. In some preferable embodiments, the base polymer (e.g. acrylic polymer) is typically obtained by emulsion polymerization of a starting monomer mixture having an aforementioned composition. As the monomer supply method in, for instance, emulsion polymerization, a suitable method can be employed among the all-at-once method where all the starting monomer mixture is supplied in one portion, gradual supply method, portion-wise supply method, etc. An emulsion of some or all of the monomers pre-mixed with water and a surfactant can be supplied to the polymerization vessel.

The polymerization temperature can be suitably selected in accordance with the monomer species, the solvent species, and the polymerization initiator species used, etc. The polymerization temperature is suitably about 20° C. or higher, preferably about 40° C. or higher, more preferably about 50° C. or higher; it can also be about 60° C. or higher, about 65° C. or higher, or even about 70° C. or higher. The polymerization temperature is usually suitably about 170° C. or lower (typically about 140° C. or lower), or preferably about 95° C. or lower (e.g. about 85° C. or lower). In emulsion polymerization, the polymerization temperature is preferably about 95° C. or lower (e.g. about 85° C. or lower).

Examples of the polymerization initiator include, but not limited to, azo-based initiators, peroxide-based initiators and redox-based initiators by the combination of a peroxide and a reducing agent. For the polymerization initiator, solely one species or a combination of two or more species can be used.

Examples of azo-based initiators include 2,2'-azobisisobutyronitrile, 2,2'-azobis[N-(2-carboxyethyl)-2-methylpropionamidine] hydrate, 2,2'-azobis(2-methylpropionamidine) disulfate salt, 2,2'-azobis(2-methylpropionamidine) dihydrochloride, 2,2'-azobis[2-(5-methyl-2-imidazolin-2-yl)propane] dihydrochloride and 2,2'-azobis(N,N'-dimethylene isobutylamidine) dihydrochloride.

Examples of the peroxide-based initiator include persulfates such as potassium persulfate and ammonium persulfate; benzoyl peroxide, t-butyl hydroperoxide, di-t-butyl peroxide, dicumyl peroxide, dilauroyl peroxide, di-n-octanoyl peroxide, di(4-methylbenzoyl) peroxide, t-butyl peroxybenzoate, t-butyl peroxyisobutyrate, t-hexyl peroxypivalate, t-butyl peroxypivalate, di(2-ethylhexyl) peroxydicarbonate, di(4-t-butylcyclohexyl) peroxydicarbonate, di-sec-butyl peroxydicarbonate, t-butyl peroxyneodecanoate, 1,1,3,3-tetramethylbutylperoxy-2-ethylhexanoate, 1,1-bis(t-butylperoxy)-3,3,5-trimethylcyclohexane, 1,1-bis(t-butylperoxy)cyclododecane, 1,1-bis(t-hexylperoxy)cyclohexane and hydrogen peroxide.

Examples of the redox-based initiator include a combination of a peroxide and ascorbic acid (combination of hydrogen peroxide and ascorbic acid, etc.), a combination of a peroxide and an iron(II) salt (combination of hydrogen peroxide and an iron(II) salt, etc.), and a combination of a persulfate salt and sodium hydrogen sulfite.

The polymerization initiator can be used in an amount suitably selected in accordance with the type of initiator, monomer species (monomer composition), polymerization conditions, etc. The amount of polymerization initiator used is, for instance, about 0.0005 part to 1 part by weight to 100 parts by weight of the starting monomers; and it is suitably, for instance, in the range between about 0.001 part and 0.5 part by weight; preferably in the range between 0.002 part and 0.3 part by weight; and more preferably in the range between 0.005 part and 0.1 part by weight.

In the emulsion polymerization, as necessary, various heretofore known chain transfer agents (which can be considered also as a molecular weight-adjusting agent or polymerization degree-adjusting agent) can be used. For the chain transfer agent, solely one species or a combination of two or more species can be used. As the chain transfer agent, mercaptans can be preferably used, such as n-dodecyl mercaptan, t-dodecyl mercaptan, glycidyl mercaptan, 2-mercaptoethanol, mercaptoacetic acid, thioglycolic acid, 2-ethylhexyl thioglycolate and 2,3-dimercapto-1-propanol. When using a chain transfer agent, its amount used to 100 parts by weight of the total monomer content is, for instance, possibly about 0.01 to 1 part by weight, preferably 0.02 to 0.1 part by weight, or more preferably 0.03 to 0.07 part by weight. The art disclosed herein can be preferably practiced in an embodiment without use of a chain transfer agent.

The surfactant (emulsifier) used in emulsion polymerization is not particularly limited. Commonly-known anionic surfactants, nonionic surfactants and the like can be used. A surfactant having a radically polymerizable functional group can also be used. Hereinafter, the surfactant having a radically polymerizable functional group is referred to as a reactive (polymerizing) surfactant. In contrast to this, a general surfactant free of a radically polymerizable functional group may be referred to as a non-reactive (non-polymerizing) surfactant. For the surfactant, solely one species or a combination of two or more species can be used.

Examples of the non-reactive surfactant include anionic emulsifiers such as sodium lauryl sulfate, ammonium lauryl sulfate, sodium dodecyl benzene sulfonate, sodium polyoxyethylene lauryl sulfate, sodium polyoxyethylene alkyl ether sulfates, ammonium polyoxyethylene alkyl phenyl ether sulfates, sodium polyoxyethylene alkyl phenyl ether sulfates, and sodium polyoxyethylene alkyl sulfosuccinates; and non-ionic emulsifiers such as polyoxyethylene alkyl ethers, polyoxyethylene alkyl phenyl ethers, polyoxyethylene aliphatic acid esters, and polyoxyethylene-polyoxypropylene block polymers.

The reactive surfactant is not particularly limited as far as it has a radically polymerizable functional group. For instance, the reactive surfactant may have a structure such that a radically polymerizable functional group is incorporated in an aforementioned anionic surfactant or nonionic surfactant. Examples of the radically polymerizable functional group include vinyl group, propenyl group, isopropenyl group, vinyl ether group (vinyloxy group), and allyl ether group (allyloxy group). The concept of propenyl group referred to herein encompasses 1-propenyl group ($CH_3$—CH=CH—) and 2-propenyl group ($CH_2$=CH—$CH_2$—which may be called allyl group).

Examples of an anionic reactive surfactant include polyoxyethylene (allyloxymethyl) alkyl ether sulfates (e.g. ammonium salts), polyoxyethylene nonyl propenyl phenyl ether sulfates (e.g. ammonium salts), alkyl allyl sulfosuccinates (e.g. sodium salts), methacryloxy polyoxypropylene sulfuric acid ester salts (e.g. sodium salts), and polyoxyalkylene alkenyl ether sulfates (e.g. an ammonium salt having an isopropenyl group as the terminal alkenyl group). When the anionic reactive surfactant is forming a salt, the salt can be, for instance, a metal salt such as sodium salt or a non-metal salt such as ammonium salt and amine salt.

Examples of a nonionic reactive surfactant include polyoxyethylene nonyl propenyl phenyl ether.

Although no particular limitations are imposed, in some embodiments, a reactive surfactant having an oxyethylene chain can be preferably used. The oxyethylene chain refers to a structure of repeating oxyethylene units, that is, a structural moiety represented by —($C_2H_4O$)$_n$—, with n indicating the number of repeats of the oxyethylene unit. For instance, in a preferable reactive surfactant, the number of repeats, n, is about 5 to 30 (e.g. 8 to 25).

From the standpoint of the polymerization stability during the emulsion polymerization, in some embodiments, it is preferable to use a reactive surfactant having a propenyl group. A preferable reactive surfactant has a propenyl group and also an oxyethylene chain.

From the standpoint of the emulsifying ability, etc., in some embodiments, an anionic reactive surfactant (e.g. an anionic reactive surfactant having an oxyethylene chain) can be preferably used. When the anionic reactive surfactant is in a salt form, as the salt, a non-metal salt is preferable. In particular, an ammonium salt is preferable.

When using a nonionic reactive surfactant, more favorable results can be obtained by the combined use with other surfactant(s), such as an anionic reactive surfactant, anionic non-reactive surfactant and nonionic non-reactive surfactant.

By carrying out emulsion polymerization of the starting monomer mixture in the presence of a reactive surfactant having a radically polymerizable functional group, the reactive surfactant may undergo a reaction to be incorporated into the base polymer (e.g. acrylic polymer). The reactive surfactant incorporated in the acrylic polymer is less likely to bleed out to the PSA layer surface because its move within the PSA layer is limited. Accordingly, the use of the reactive surfactant can reduce bleed-out of a low molecular weight compound to the PSA layer surface. This is preferable from the standpoint of the low-contaminating properties. From the standpoint of obtaining greater low-contaminating properties, it is preferable to apply an embodiment using solely a reactive surfactant as the surfactant for emulsion polymerization.

The amount of surfactant is preferably about 0.1 part by weight or greater (e.g. about 0.5 part by weight or greater) to 100 parts by weight of the total monomer content. The amount of surfactant is suitably about 10 parts by weight or less (e.g. about 5 parts by weight or less) or possibly even about 4 parts by weight or less to 100 parts by weight of the total monomer content.

The PSA layer disclosed herein may comprise about 50% or more base polymer by weight. The base polymer content in the PSA layer is possibly about 75% by weight or higher, or suitably about 85% by weight or higher. With the PSA having at least the prescribed percentage of base polymer, contamination of the protected article is readily prevented or inhibited; and the adhesive properties also tend to be highly stable to aging. In some preferable embodiments, the base polymer content in the PSA layer is about 90% by weight or higher, more preferably about 95% by weight or higher, yet more preferably about 97% by weight or higher, or possibly even 98% by weight or higher (e.g. about 99% by weight or higher). The maximum base polymer content of the PSA layer is 100% by weight. To obtain projected properties (e.g. alteration resistance, tightness of adhesion, etc.), it can be 99.5% by weight or lower, 98.5% by weight or lower, or even 97.5% by weight or lower.

The PSA layer of the protective sheet disclosed herein can be formed from various forms of PSA compositions. From the standpoint of reducing environmental stress, it is preferable to use a water-dispersed PSA composition with at least some of the PSA dispersed in water. Favorable examples of the water-dispersed PSA composition include a water-dispersed acrylic PSA composition (a water-dispersed PSA composition comprising an acrylic polymer as the base polymer). Examples of other forms of the PSA composition include a solvent-based PSA composition containing the PSA (adhesive component(s)) in an organic solvent, an active energy ray-curable PSA composition formulated so as to cure with active energy rays such as UV rays and radioactive rays to form PSA, and a hot-melt PSA composition which is applied in the molten state by heating and forms PSA when it cools to near room temperature. Water may be added afterwards to these non-water-dispersed PSA compositions for use.

(Crosslinking Agent)

In the art disclosed herein, the PSA composition used to form the PSA layer preferably comprises a crosslinking agent. With the use of crosslinking agent, the surface hardness of the PSA layer can be suitably adjusted. The type of crosslinking agent used is not particularly limited and can be suitably selected from heretofore known crosslinking agents.

Specific examples of the crosslinking agent include oxazoline-based crosslinking agents, aziridine-based crosslinking agents, isocyanate-based crosslinking agents, epoxy-based crosslinking agents, melamine-based crosslinking agents, peroxide-based crosslinking agents, urea-based crosslinking agents, metal alkoxide-based crosslinking agents, metal chelate-based crosslinking agents, metal salt-based crosslinking agents, carbodiimide-based crosslinking agents, hydrazine-based crosslinking agents, amine-based crosslinking agents, and silane coupling agents. These can be used solely as one species or in a combination of two or more species. For instance, it is preferable to use one, two or more species selected from a group consisting of oxazoline-based crosslinking agents, aziridine-based crosslinking agents, isocyanate-based crosslinking agents and epoxy-based crosslinking agents. In particular, oxazoline-based crosslinking agent, isocyanate-based crosslinking agent and epoxy-based crosslinking agent are more preferable. In an embodiment using a water-dispersed PSA composition, a preferable crosslinking agent is soluble or dispersible in water and a particularly preferable crosslinking agent is soluble in water (i.e. water-soluble).

As the oxazoline-based crosslinking agent, a species having one or more oxazoline groups per molecule can be used without particular limitations. In the water-dispersed PSA composition, it is preferable to use a water-soluble or water-dispersible oxazoline-based crosslinking agent.

The oxazoline group can be either 2-oxazoling group, 3-oxazoline group or 4-oxazoline group. Usually, a 2-oxazoline group-containing oxazoline-based crosslinking agent can be preferably used. As the oxazoline-based crosslinking agent, a water-soluble copolymer or a water-dispersed copolymer can be used, which is obtained by copolymerizing an addition-polymerizable oxazoline such as 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline and 2-isopropenyl-5-ethyl-2-oxazoline with other monomer(s).

Examples of a commercial oxazoline-based crosslinking agent include products of Nippon Shokubai Co., Ltd., under trade names EPOCROS WS-500, EPOCROS WS-700, EPOCROS K-2010E, EPOCROS K-2020E and EPOCROS K-2030E.

Examples of the aziridine-based crosslinking agent include trimethylolpropane tris[3-(1-aziridinyl)propionate] and trimethylolpropane tris[3-(1-(2-methyl)aziridinylpropionate)]. Examples of commercial aziridine-based crosslinking agent include product names CHEMITITE PZ-33 and CHTEMITITE DZ-22E available from Nippon Shokubai Co., Ltd.

As an example of the isocyanate-based crosslinking agent, a bifunctional or higher polyfunctional isocyanate compound can be used. Examples include aromatic isocyanates such as tolylene diisocyanates, xylylene diisocyanate, polymethylene polyphenyl diisocyanate, tris(p-isocyanatophenyl)thiophosphate, and diphenylmethane diisocyanate; alicyclic isocyanates such as isophorone diisocyanate; and aliphatic isocyanates such as hexamethylene diisocyanate. Commercial products include isocyanate adducts such as trimethylolpropane/tolylene diisocyanate trimer adduct (trade name CORONATE L available from Tosoh Corporation), trimethylolpropane/hexamethylene diisocyanate trimer adduct (trade name CORONATE HL available from Tosoh Corporation) and hexamethylene diisocyanate isocyanurate (trade name CORONATE HX available from Tosoh Corporation). In the water-dispersed PSA composition, it is preferable to use a water-soluble or water-dispersible isocyanate-based crosslinking agent. For instance, a water-soluble, water-dispersible or self-emulsifying isocyanate-based crosslinking agent can be preferably used. A so-called blocked isocyanate-based crosslinking agent can be preferably used as an isocyanate-based crosslinking agent.

As the epoxy-based crosslinking agent, a species having two or more epoxy groups per molecule can be used without particular limitations. An epoxy-based crosslinking agent having 3 to 5 epoxy groups per molecule is preferable. In the water-dispersed PSA composition, it is preferable to use a water-soluble or water-dispersible epoxy-based crosslinking agent.

Specific examples of the epoxy-based crosslinking agent include N,N,N',N'-tetraglycidyl-m-xylenediamine, 1,3-bis(N,N-diglycidylaminomethyl)cyclohexane, 1,6-hexanediol diglycidyl ether, polyethylene glycol diglycidyl ether, and polyglycerol polyglycidyl ether.

Commercial epoxy-based crosslinking agents include products of Mitsubishi Gas Chemical Co., Inc., under trade names TETRAD-X and TETRAD-C, a product of DIC Corporation under trade name EPICLON CR-5L, a product of Nagase ChemteX Corporation under trade name DENACOL EX-512, and a product of Nissan Chemical Industries, Ltd., under trade name TEPIC-G.

As the carbodiimide-based crosslinking agent, a low or high molecular weight compound having two or more carbodiimide groups can be used. In a water-dispersed PSA composition, it is preferable to use a water-soluble or water-dispersible carbodiimide-based crosslinking agent. Examples of commercial carbodiimide-based crosslinking agents include the CARBODILITE series such as the CARBODILITE V series (aqueous solutions) including CARBODILITE V-02, CARBODILITE V-02-L2, and CARBODILITE V-04; and the CARBODILITE E series (aqueous dispersions) including CARBODILITE E-01, CARBODILITE E-02, and CARBODILITE E-04 available from Nisshinbo Holdings, Inc.

The crosslinking agent content (the total amount of crosslinking agent) in the PSA composition disclosed herein is not particularly limited and can be suitably selected in view of the composition and the molecular weight of the base polymer so as to obtain favorable properties after crosslinked. While no particular limitations are imposed, the amount of the crosslinking agent used to 100 parts by weight of the base polymer (typically an acrylic polymer) is, for instance, about 0.01 part by weight or greater, suitably about 0.1 part by weight or greater, or preferably about 1 part by weight or greater (e.g. about 2 parts by weight or greater). From the standpoint of the adhesion, etc., the amount of the crosslinking agent is suitably about 15 parts by weight or less (preferably about 10 parts by weight or less, e.g. about 5 parts by weight or less) to 100 parts by weight of the base polymer. From the standpoint of increasing the tightness of adhesion to adherends, it is preferably about 4 parts by weight or less, more preferably less than 3.5 parts by weight, or yet more preferably less than 3 parts by weight.

(Basic Compound)

The PSA composition disclosed herein (or even the PSA layer; the same applies hereinafter) may comprise a basic compound. In the water-dispersed PSA composition, the base polymer (e.g. acrylic polymer) as the primary component may have an acidic group, for instance, a carboxy group, etc. The use of a basic compound for such a polymer brings about good applicability and stability upon acid/base neutralization reaction. Accordingly, the basic compound can be used as a pH-adjusting agent in the PSA composition. As used herein, the "basic compound" refers to a compound that is basic (alkaline) as an aqueous solution.

As the basic compound, both an organic basic compound and an inorganic basic compound can be used. Examples of organic basic compounds include organic amine-based compounds such as alkanol amines, alkyl amines and polyalkylene polyamines. Examples of inorganic basic compounds include ammonia as well as hydroxides, carbonates and bicarbonates of ammonia, alkali metals and alkaline earth metals. Specific examples of the hydroxides include potassium hydroxide and sodium hydroxide. Specific examples of the carbonates and bicarbonates include ammonium bicarbonate, ammonium carbonate, potassium bicarbonate, potassium carbonate, sodium bicarbonate and sodium carbonate. These can be used solely as one species or in a combination of two or more species. In particular, ammonia is preferable from the standpoint of ease of adjustment of the PSA composition's viscosity, dispersion stability and applicability. The non-ammonia basic compound (basic compound substituted for ammonia) is not particularly limited while hydroxides of alkali metals and hydroxides of alkaline earth metals are preferable. In particular, potassium hydroxide and sodium hydroxide are more preferable. While no particular limitations are imposed, in a typical embodiment, ammonia is added as ammonia water to the PSA composition and sodium hydroxide can also be added as an aqueous sodium hydroxide solution.

The PSA composition disclosed herein may include ammonia or may be essentially free of ammonia. In some embodiments, the PSA composition includes ammonia. In this embodiment, the ammonia content in the PSA composition can be selected so that the resulting PSA layer has an ammonia content below the prescribed value, determined by hot water extraction. Ammonia can be used in a limited amount by using ammonia and a non-ammonia basic compound together. Alternatively, the PSA layer's ammonia content determined by hot water extraction can be adjusted to below the prescribed value by allowing ammonia to evaporate by selecting conditions for procedures such as drying in the formation of the PSA layer (ammonia content-reducing process). Limiting the use of ammonia can be combined with the ammonia content-reducing process. In other embodiments, the PSA composition is free of ammonia. In this embodiment, for instance, as a pH-adjusting agent, one, two or more species of non-ammonia basic compounds can be used. Alternatively, the art disclosed herein can be implemented in an embodiment where the PSA layer is essentially free of a non-ammonia basic compound.

(PSA Composition's pH)

The pH of the PSA composition (in particular, the liquid phase of the PSA composition) disclosed herein is not particularly limited. It can be selected in a suitable range in view of the applicability, stability, storability, handling properties, etc. The PSA composition's pH can be about 11 or lower. From the standpoint of the applicability, it is suitably about 10 or lower, or preferably about 9 or lower (e.g. about 8 or lower). The PSA composition's pH is possibly about 5 or higher, or suitably about 6 or higher. From the standpoint of the applicability, it is preferably 7 or higher, or can be in a range (about 7 to 8) around neutral. The PSA layer can be preferably formed from a PSA composition upon pH adjustment to have a pH in the prescribed range. The PSA composition's pH can be selected and adjusted based on the base polymer's molecular design and amount contained, addition of pH-adjusting agent, etc.

(Phosphate)

The PSA composition (and also the PSA layer) disclosed herein may include a phosphate. Examples of the phosphate include alkyl phosphates such as lauryl phosphate and a lauryl phosphate salt; and a phosphate having an oxyethylene chain and a salt thereof. The salt can be, for instance, sodium salts, potassium salts, barium salts and triethanolamine salts of these phosphates. In the following, unless otherwise noted, the "phosphate" includes a salt. In particular, it is more preferable to use a phosphate having an oxyethylene chain. The oxyethylene chain-containing phosphate can suppress the increase in adhesive strength with aging (i.e. increase the stability of the adhesive strength) while preventing penetration of corrosion-induced components such as water, an acid and a base at the interface between the PSA layer and the adherend surface. Here, the oxyethylene chain refers to a structural moiety in chain form that includes at least one ethylene oxide (EO) unit and may further include other oxyalkylene unit(s) (e.g. oxyalkylene unit(s) with about 3 to 6 carbon atoms). One favorable example of the oxyethylene chain-containing phosphate is a phosphate having an oxyethylene chain formed with an EO unit or repeats of this. For instance, a phosphate represented by the next general formula (a) or a salt thereof can be preferably used.

[Chem 1]

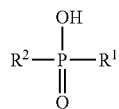

(a)

In the general formula (a), $R^1$ is —OH or —$(OCH_2CH_2)_nOR^3$; $R^2$ represents —$(OCH_2CH_2)_mOR^4$; n and m indicate the number of moles of EO added. The number of moles of EO added, n, is an integer between 1 and 30; it can be typically an integer between about 1 and 20, preferably an integer between about 1 and 10, for instance, an integer between about 1 and 8. The number of moles of EO added, n, is preferably an integer between about 1 and 6, or yet more preferably an integer between 1 and 4 (e.g. 2 and 4). In the general formula (a), the number of moles of EO added, m, can be typically about the same as the number of moles of EO added for n; n and m may be identical or different. $R^3$ and $R^4$ are mono-valent organic groups (typically hydrocarbon groups); for instance, each can be individually a group selected among an alkyl group, cycloalkyl group, aryl group, alkylaryl group, and arylalkyl group. $R^3$ and $R^4$ are preferably linear or branched alkyl groups, aryl groups or alkylaryl groups. $R^3$ and $R^4$ are individually an organic group with 1 to 30 carbon atoms, or possibly an organic group with 6 or more (preferably 8 or more, e.g., 11 or more) carbon atoms. In a preferable embodiment, $R^3$ and $R^4$ can be organic groups with 20 or fewer or preferably 18 or fewer, for instance, 15 or fewer carbon atoms. The phosphate salts represented by the general formula (a) can be, for instance, sodium salts, potassium salts, barium salts and triethanolamine salts of these phosphates. For the phosphate, solely one species or a combination of two or more species can be used.

Examples of the phosphates include polyoxyethylene alkylphosphoric acid esters such as polyoxyethylene tridecyl ether phosphate, polyoxyethylene lauryl ether phosphate, and polyoxyethylene octadecyl ether phosphate; and polyoxyethylene alkyl aryl phosphoric acid esters such as polyoxyethylene nonyl phenyl ether phosphate, polyoxyethylene octyl phenyl ether phosphate, polyoxyethylene dinonyl phenyl ether phosphate, and polyoxyethylene dioctyl phenyl ether phosphate. In some embodiments, a phosphoric acid ester having a molecular weight of 150 to 5000 can be preferably used.

The amount of phosphate used can be, for instance, about 0.05 part by weight or greater to 100 parts by weight of the base polymer (e.g. an acrylic polymer); it is preferably about 0.1 part by weight or greater, or more preferably about 0.3 part by weight or greater (e.g. about 0.5 part by weight or greater). From the standpoint of leaving a lower degree of contamination on the adherend surface, the amount of phosphate used to 100 parts by weight of the base polymer (e.g. an acrylic polymer) is suitably about 30 parts by weight or less (e.g. 20 parts by weight or less), preferably about 10 parts by weight or less, more preferably about 5 parts by weight or less, yet more preferably about 3 parts by weight or less, or particularly preferably about 2 parts by weight or less (e.g. 1 part by weight or less), for instance, possibly 0.1 part by weight or less. From the standpoint of avoiding adherend contamination, the art disclosed herein can be implemented in an embodiment where the PSA layer is essentially free of a phosphate.

(Rust Inhibitor)

The PSA layer disclosed herein may include or may be free of a rust inhibitor. The PSA layer according to some preferable embodiments may include a rust inhibitor. The rust inhibitor is not particularly limited. Examples include amine compounds, azole-based compounds, nitrites, ammonium benzoate, ammonium phthalate, ammonium stearate, ammonium palmitate, ammonium oleate, ammonium carbonate, dicyclohexylaminebenzoic acid salts, urea, urotropin, thiourea, phenyl carbamate, and cyclohexylammonium-N-cyclohexyl carbamate (CHC). These rust inhibitors can be used singly as one species or in a combination of two or more species. Among them, amine-based compounds and azole-based compounds are preferable.

The amount of rust inhibitor (e.g. an amine-based compound (amine-based rust inhibitor) or an azole-based compound (azole-based rust inhibitor) is not particularly limited. It can be, for instance, 0.01 part by weight or greater (typically 0.05 part by weight or greater) to 100 parts by weight of the base polymer. From the standpoint of obtaining greater anti-erosion effects, the amount may be 0.1 part by weight or greater, 0.3 part by weight or greater, or even 0.5 part by weight or greater. On the other hand, from the standpoint of the prevention of erosion due to components and the PSA's cohesive strength, the rust inhibitor content is suitably below 8 parts by weight to 100 parts by weight of the base polymer; or it is possibly 6 parts by weight or less, preferably 5 parts by weight or less, for instance, 3 parts by weight or less, or even 1 part by weight or less. The art disclosed herein can be preferably implemented in an embodiment using essentially no rust inhibitor.
(Other Components, Etc.)

The PSA composition can comprise, as necessary, a known tackifier such as a rosin-based tackifier, terpene-based tackifier and hydrocarbon-based tackifier. From the standpoint of avoiding an excessive increase in peel strength, the amount of tackifier is preferably about 5 parts by weight or less to 100 parts by weight of the base polymer, or more preferably about 1 part by weight or less. For the protective sheet disclosed herein, the adhesive strength can be effectively controlled by the base polymer's composition and Tg as well as PSA's gel fraction, etc.; and therefore, the protective sheet can be preferably made in an embodiment using no tackifier as well.

The PSA composition may comprise, as necessary, various optional additives generally known in the field of PSA compositions, such as viscosity-adjusting agent (viscosifier, etc.), crosslinking accelerator, plasticizer, softener, filler, anti-static agent, anti-aging agent, UV-absorber, antioxidant, photo-stabilizing agent and defoamer. As the optional additive, an optional polymer different from the base polymer (e.g. an acrylic polymer) can be used as well. The optional polymer content is, for instance, about 10% by weight or less (e.g. about 1% by weight or less) of the PSA composition. The PSA composition disclosed herein may be essentially free of the optional polymer. In the PSA composition according to some embodiments, the amount of plasticizer such as aliphatic acid ester can be limited to, for instance, below 10 parts by weight (e.g. below 1 part by weight) to 100 parts by weight of base polymer. In typical, the PSA composition may be essentially free of a plasticizer. The art disclosed herein can be preferably implemented in an embodiment essentially free of an anti-static agent (possibly a conducting agent) such as an ionic compound (e.g. ionic liquid, alkaline metal salt). With respect to other matters about these various optional additives, various heretofore known additives and methods can be selected based on technical common knowledge. Because these additives do not characterize the present invention in particular, details are omitted.

In the art disclosed herein, in an embodiment using a water-dispersed PSA composition for PSA layer formation, the PSA composition can be prepared, for instance, by mixing an acrylic polymer dispersion in aqueous liquid obtained by emulsion polymerization using a surfactant with other components (e.g. crosslinking agent, etc.) used as necessary. For instance, it is possible to use a polymerization reaction mixture obtained by emulsion polymerization or the polymerization reaction mixture subjected as necessary to a treatment such as pH adjustment (e.g. neutralization), non-volatile content adjustment and viscosity adjustment.

While no particular limitations are imposed, from the standpoint of efficient drying, etc., the non-volatile content (NV) of the PSA composition can be about 20% by weight or higher (typically about 30% by weight or higher, preferably about 40% by weight or higher). From the standpoint of the ease of application, etc., it can be about 75% by weight or lower (typically about 70% by weight or lower, preferably about 60% by weight or lower).
(Formation of PSA Layer)

The PSA layer can be formed based on a known method for forming PSA layers in PSA sheets. For instance, it is preferable to employ a direct method where the PSA composition is directly provided (typically applied) to the substrate and allowed to cure to form a PSA layer. Alternatively, it is also possible to employ a transfer method where the PSA composition is provided to a releasable surface (release face) and allowed to cure to form a PSA layer on the surface and the resulting PSA layer is transferred to the substrate. As the release face, the surface of a release liner, the substrate's backside treated with release agent, or the like can be used. While the PSA layer is typically formed in a continuous form, it can be formed in a regular or random pattern of dots, stripes, etc.

The PSA composition can be applied, using a heretofore known coater, for instance, a gravure roll coater, reverse roll coater, kiss roll coater, dip roll coater, die coater, bar coater, knife coater and spray coater. Alternatively, the PSA composition can be applied by immersion, curtain coating, etc. From the standpoint of accelerating the crosslinking reaction, increasing the productivity, etc., the PSA composition is preferably dried with heat. The drying temperature is possibly, for example, about 40° C. to 150° C. or preferably about 50° C. to 130° C. (e.g. 60° C. to 100° C.). After dried, the PSA composition can be allowed to further age for purposes such as adjusting the distribution or migration of components in the PSA layer, advancing the crosslinking reaction, and lessening the strain possibly present in the substrate and the PSA layer.
(Amount of Chloride Ions)

In the PSA layer disclosed herein, the amount of chloride ions (chloride ion amount) determined by hot water extraction is not particularly limited. In some embodiments, the amount of chloride ions per gram of PSA (layer) can be 350 µg or less. According to the PSA layer with such a limited chloride ion amount, erosion tends to be prevented in the Low-E glass plate being protected. The chloride ion amount per gram of PSA (layer) is suitably about 300 µg or less, or possibly about 200 µg or less (e.g. about 150 µg or less). By limiting the chloride ion amount of the PSA in contact with the Low-E glass plate, the resulting embodiment is likely to allow long-term prevention of erosion in the Low-E glass plate. In some preferable embodiments, the chloride ion amount per gram of PSA (layer) is about 100 µg or less, more preferably about 95 µg or less, yet more preferably about 90 µg or less, particularly preferably about 85 µg or less, or possibly about 75 µg or less (about 70 µg or less). The minimum chloride ion amount per gram of PSA (layer) is ideally 0 µg; however, from the standpoint of the productivity, allowable level for practical use, etc., it can be about 1 µg or greater, about 10 µg or greater, or even about 50 µg or greater. In other embodiments, the chloride ion amount per gram of PSA (layer) can be about 80 µg or greater, or even about 100 µg or greater (e.g. about 120 µg or greater). According to the art disclosed herein, good anti-erosion effects can be obtained with the PSA layer having such a chloride ion concentration without impairing the adhesive properties, etc. The chloride ion amount in the PSA can be adjusted by using components having low chloride ion contents, subjecting the components to be used such as water to a treatment to remove chloride ions, and so on.

The chloride ion amount of the PSA layer is determined by the method described below. Alternatively, it can also be determined as follows: Chloride ions in the protective sheet and the substrate layer are quantified by hot water extraction; from the difference in chloride ion amount between the two, the chloride ion amount from the PSA layer is determined; and the resulting value is converted to a per unit PSA (layer) value.

[Chloride Ion Amount of PSA (Layer)]

Of the protective sheet subject to measurement, about 10 mg of adhesive components is obtained, placed in a polypropylene (PP) container and weighed. Subsequently, 100 mL of ultrapure water is added and a lid is placed. In a drier at 120° C., thermal extraction is carried out for one hour. With respect to the resulting extract, by ion chromatography, chloride ions in the extract are quantified using commercial standard chloride ion solutions (available from FUJIFILM Wako Pure Chemical industries, Ltd.) to determine the chloride ion amount per gram of PSA used in the extraction. The ion chromatography conditions are as shown below.

(Analytical Conditions)

Anion Analysis:
- System: ICS-3000 available from Thermo Fisher Scientific
- Separation column: Dionex IonPac AS18-Fast (4 mm×250 mm)
- Guard column: Dionex IonPac AG18-Fast (4 mm×50 mm)
- Removal system: DionexAERS-500 (external mode)
- Detector: electrical conductivity detector
- Eluent: aqueous KOH solution (eluent generator cartridge used)
- Eluent flow rate: 1.0 mL/min
- Sample injection volution: 250 μL Cation Analysis:
- System: DX-320 available from Thermo Fisher Scientific
- Separation column: Dionex Ion Pac CS16 (5 mm×250 mm)
- Guard column: Dionex Ion Pac CG16 (5 mm×50 mm)
- Removal system: Dionex CSRS-500 (recycle mode)
- Detector: electrical conductivity detector
- Eluent: aqueous methanesulfonic acid solution
- Eluent flow rate: 1.0 mL/min
- Sample injection volution: 25 μL (Thickness of PSA Layer)

No particular limitations are imposed on the thickness of the PSA layer constituting the protective sheet disclosed herein. From the standpoint of preventing adhesive transfer to the adherend, the thickness of the PSA layer is usually about 50 μm or less, suitably about 30 μm or less, preferably about 15 μm or less, or more preferably about 8 μm or less (e.g. less than 6 μm). In other embodiments, from the standpoint of the ease of removal, etc., the thickness of the PSA layer is suitably about 5 μm or less, about 4 μm or less, or possibly, for instance, 3 μm or less. From the standpoint of the adhesion, the thickness of the PSA layer is suitably about 0.5 μm or greater, preferably about 1 μm or greater, or more preferably greater than 2 μm. The thickness of the PSA layer may be greater than 3 μm, for instance, greater than 4 μm.

<Substrate Layer>

The protective sheet disclosed herein may include a substrate layer. As the substrate layer, resin film, a rubber sheet, a foam sheet, a composite of these, etc., can be used. Examples of the rubber sheet include natural rubber sheets and butyl rubber sheets. Examples of the foam sheet include polyurethane foam sheets, and polychloroprene rubber foam sheets.

The art disclosed herein can be preferably applied to a protective sheet wherein the substrate layer is resin film. The concept of "resin film" here refers to film typically obtained by molding a thin layer from a resin composition primarily comprising resin components as described below; it should be distinguished from so-called non-woven and woven fabrics. In other words, the concept of resin film excludes non-woven and woven fabrics. Preferable resin film is essentially not foamed. In other words, non-foamed resin film can be preferably used. Here, the non-foamed resin film refers to resin film that has not been deliberately subjected to a foaming process. In particular, the resin film may have an expansion ratio lower than about 1.1 (e.g. lower than 1.05, typically lower than 1.01).

Examples of the resin components forming the resin film include polyolefinic resins (polyethylene, polypropylene, ethylene-propylene copolymer, ethylene-vinyl acetate copolymer, etc.), poly(vinyl chloride)-based resins (typically soft poly(vinyl chloride)-based resin); poly(vinyl acetate)-based resin, polyurethane-based resins (ether-based polyurethane, ester-based polyurethane, carbonate-based polyurethane, etc.), urethane (meth)acrylate-based resin, thermoplastic elastomers (olefinic elastomer, styrene-based elastomer, acrylic elastomer, etc.), polyester-based resins (polyethylene terephthalate, polybutylene terephthalate, polyethylene naphthalate, polybutylene naphthalate, etc.), polycarbonate-based resin, polyamide-based resin, polyimide-based resin, fluororesin and cellulose-based resins such as cellophane resin. Among these resins, solely one species or a combination of two or more species can be used. Favorable examples of the resin film include polyolefinic resin film, polyester-based resin film and vinyl chloride-based resin film.

While no particular limitations are imposed, in the protective sheet according to some embodiments, it is preferable to use a substrate layer that comprises, as its primary component(s), one, two or more species of resin selected from the group consisting of polyolefinic resin, poly(vinyl chloride)-based resin, polyurethane-based resin, thermoplastic elastomer and polyester-based resin (typically a substrate layer comprising such resin in an amount exceeding 50% by weight). In other embodiments, in view of the performance, ease of handling, costs, etc., a substrate layer comprising a polyolefinic resin layer, polyester-based resin layer or polyvinyl chloride-based resin layer can be preferably used. Among the resin materials, in view of the heat stability, the lightness of weight, etc., polyolefinic resins, polyurethane-based resins and olefinic elastomers are preferable; in view of the handling properties, etc., polyolefinic resins and olefinic elastomers are particularly preferable.

The protective sheet disclosed herein can be preferably made in an embodiment comprising a substrate layer that comprises a polyolefinic resin as the primary component (e.g. more than 50% by weight), that is, an embodiment wherein the substrate layer is polyolefinic resin film. For instance, it is preferable to use polyolefinic resin film in which 50% by weight or more of the entire substrate layer is polyethylene (PE) resin or polypropylene (PP) resin. In other words, in the polyolefinic resin film, the combined amount of PE resin and PP resin may account for 50% by weight or more of the entire substrate layer. The polyolefinic resin film can be a blend of PE and PP resins.

The PP resin may comprise, as the primary component, various polymer species (propylene-based polymers) that comprise propylene as a monomer unit. The PP resin may be essentially formed of one, two or more species of propylene-based polymer. The concept of propylene-based polymer here includes homopolypropylene as well as a random copolymer of propylene and other monomer(s) (random polypropylene) and a block copolymer (block polypropylene). The concept of propylene-based polymer here includes, for instance, the following species:

Propylene homopolymer (homopolypropylene), for instance, isotactic polypropylene;

Random copolymer (random polypropylene) of propylene and other α-olefin(s) (typically, one, two or more species selected from ethylene and α-olefins having 4 to 10 carbon atoms), preferably random polypropylene comprising propylene as the primary monomer (i.e. the monomer accounting for 50% by weight or more of the total monomer content);

Block copolymer (block polypropylene) of propylene and other α-olefin(s) (typically, one, two or more species selected from ethylene and α-olefins having 4 to 10 carbon atoms), preferably block polypropylene comprising propylene as the primary monomer (i.e. the monomer accounting for 50% by weight or more of the total monomer content).

The PE resin may comprise, as the primary component, various types of polymer (ethylene-based polymer) comprising ethylene as a monomer. The PE resin may be essentially formed of one, two or more species of ethylene-based polymer. The ethylene-based polymer can be an ethylene homopolymer or a copolymer (random copolymer, block copolymer, etc.) of ethylene as the primary monomer and other α-olefin(s) as secondary monomer(s). Favorable examples of the α-olefins include α-olefins having 3 to 10 carbon atoms such as propylene, 1-butene (which can be a branched 1-butene), 1-hexene, 4-methyl-1-pentene and 1-octene. For instance, it is preferable to use PE resin that comprises, as the primary component, an ethylene-based polymer in which an α-olefin as the secondary monomer is copolymerized up to about 10% by weight (typically up to about 5% by weight).

The PE resin may comprise a copolymer of ethylene and a monomer (functional monomer) containing other functional group(s) in addition to a polymerizable functional group, copolymer of an ethylene-based polymer copolymerized with such a functional monomer, or the like. Examples of a copolymer of ethylene and a functional monomer include ethylene-vinyl acetate copolymers (EVA), ethylene-acrylic acid copolymers (EAA), ethylene-methacrylic acid copolymers (EMAA), ethylene-methyl acrylate copolymers (EMA), ethylene-ethyl acrylate copolymers (EEA), ethylene-methyl methacrylate copolymers (EMMA), and copolymers of ethylene and (meth)acrylic acid (i.e. acrylic acid and/or methacrylic acid) crosslinked by metal ions.

The PE resin is not particularly limited in density. The concept of PE resin here includes all of the following: high density polyethylene (HDPE), medium density polyethylene (MDPE), low density polyethylene (LDPE) and linear low density polyethylene (LLPDE). In an embodiment, the density of the PE resin can be, for instance, about 0.90 g/cm$^3$ to 0.94 g/cm$^3$. Preferable PE resins include LDPE and LLDPE. The PE resin may comprise one, two or more species of LDPE and one, two or more species of LLDPE. There are no particular limitations to the respective blend ratios of LDPE and LLDPE, or to the LDPE to LLDPE blend ratio. They can be suitably selected to form a PE resin having desirable properties. As the substrate layer of the protective sheet disclosed herein, it is preferable to use polyethylenic resin film such as LLDPE film whose LLDPE content is higher than 50% by weight (preferably about 75% by weight or higher, e.g. about 90% by weight or higher) and LDPE film whose LDPE content is higher than 50% by weight (preferably about 75% by weight or higher, e.g. about 90% by weight or higher). Laminate resin film comprising such polyethylenic resin film as a component can be used as well.

The resin film (e.g. polyolefinic resin film) used as the substrate layer of the protective sheet disclosed herein may comprise, as necessary, suitable components allowable in the substrate layer. Examples of additives that can be suitably added include filler, colorant (pigment such as inorganic pigment, dye), antioxidant, photostabilizer (including radical scavenger and UV absorber), antistatic agent, plasticizer, slip agent, and anti-blocking agent. Each additive can be added, for instance, in an amount similar to a typical amount in the field of resin film used as substrate layers and the like of protective sheets.

The substrate layer may have a mono-layer structure or a multi-layer structure formed of two, three or more layers. In a multi-layer structure, it is preferable that at least one layer (preferably each layer) is formed of aforementioned resin film. For instance, in a preferable substrate layer, 75% or more (more preferably 90% or more) of the thickness is attributed to mono-layer or multi-layer (typically mono-layer) polyolefinic resin film. The substrate layer may be entirely formed of mono-layer or multi-layer polyolefinic resin film. From the standpoint of the cost-effectiveness, it is preferable to use a substrate layer formed of mono-layer resin film (e.g. LLDPE film, LDPE film, etc.).

The method for producing the substrate layer can be suitably selected among heretofore known methods and is not particularly limited. For instance, when resin film is used as the substrate layer, it is possible to use resin film fabricated by suitably employing a heretofore known general film-forming method such as inflation molding, extrusion, T-die cast molding, and calendar roll molding.

In an embodiment where at least one face (the PSA layer-side face) of the substrate layer is a resin film surface, the resin film surface can be subjected to a heretofore known surface treatment such as corona discharge treatment, plasma treatment, ozone exposure, flame exposure, UV irradiation, acid treatment, alkali treatment, and primer coating. These surface treatments may enhance the tightness of adhesion between the substrate layer and the PSA layer, or the anchoring of the PSA layer onto the substrate layer. In an embodiment using polyolefinic resin film as the substrate layer, it is particularly meaningful to provide these surface treatments.

The thickness of the substrate layer constituting the protective sheet disclosed herein is not particularly limited. The thickness of the substrate layer can be, for instance, about 800 μm or less (typically about 250 μm or less). In some embodiments, the thickness of the substrate layer (typically, non-foamed resin film) is preferably about 150 μm or less, more preferably about 100 μm or less, or yet more preferably less than 65 μm, for instance, less than 55 μm. With decreasing thickness of the substrate layer, the protective sheet tends to exhibit greater conformability to the adherend shape while its lifting and peeling tend to be inhibited. From the standpoint of adherend protection and handling properties, etc., the thickness of the substrate layer can be typically about 10 μm or greater, preferably about 25 μm or greater, more preferably greater than about 30 μm, or yet more preferably greater than 40 μm, or possibly, for instance, greater than 45 μm.

<Properties of Protective Sheet>
(Initial to-Glass Adhesive Strength)

The protective sheet disclosed herein suitably has an initial peel strength (initial to-glass peel strength) of about 0.01 N/20 mm or greater, determined at a tensile speed of 0.3 m/min at 180° peel angle after applied to a Low-E glass plate for 30 minutes. In some embodiments, the initial peel strength can be about 0.05 N/20 mm or greater (e.g. about 0.1 N/20 mm or greater). In some preferable embodiments, the initial peel strength can be about 0.5 N/20 mm or greater (e.g. about 1 N/20 mm or greater), or even about 1.5 N/20 mm or greater. The protective sheet showing such initial peel strength can adhere well to an adherend in relatively short time with less likelihood to lift off the adherend and provide good protection. The maximum initial peel strength is not particularly limited. From the standpoint of the light peel, it is suitably about 5 N/20 mm or less, or preferably about 2.5 N/20 mm or less (e.g. about 2 N/20 mm or less). The initial peel strength is determined by the method described below.

[Initial Peel Strength]

The protective sheet to be measured is cut to a 20 mm wide by 100 mm long strip to prepare a test piece. In a standard environment at 23° C., 50% RH, with a 2 kg rubber roller moved back and forth twice, the test piece is press-bonded to a Low-E glass plate as the adherend. The sample is stored in the standard environment for 30 minutes. In the same standard environment, using a universal tensile tester, the initial peel strength (initial to-glass adhesive strength) (N/20 mm) is determined at a tensile speed of 0.3 m/min, at 180° peel angle. As the Low-E glass plate, product number RSFL6AS (100 mm×100 mm) available from Nippon Sheet Glass Co., Ltd. is used. It is noted that as the adherend, any Low-E glass plate can be used without particular limitations and a product comparable to RSFL6AS or other commercial Low-E glass plate can be used as well.

(Aged to-Glass Adhesive Strength)

The protective sheet disclosed herein preferably has an aged peel strength (aged to-glass adhesive strength) of about 5 N/20 mm or less, determined at a tensile speed of 0.3 in/min, at 180° peel angle, after applied to a Low-E glass plate and stored at 50° C. for 7 days. With the protective sheet satisfying this property, even when it is applied to the adherend for a relatively long time, the aged adhesive strength is sufficiently suppressed and its light peel from adherend can be maintained. Thus, it shows excellent efficiency of removal from adherends. With the protective sheet wherein the aged peel strength is about 4 N/20 mm or less (more preferably about 2 N/20 mm or less), greater efficiency of removal can be obtained. From the standpoint of inhibiting lifting and peeling while the adherend is protected (e.g. during processing of the adherend with the protective sheet applied thereon), the aged peel strength is suitably about 0.05 N/20 mm or greater, preferably about 0.1 N/20 mm or greater, or more preferably about 0.3 N/20 mm or greater. The aged peel strength can also be about 1 N/20 mm or greater. The aged peel strength is determined by the method described below.

[Aged Peel Strength]

The protective sheet to be measured is cut to a 20 mm wide by 100 mm long strip to prepare a test piece. In a standard environment at 23° C., 50% RH, with a 2 kg rubber roller moved back and forth twice, the test piece is press-bonded to a Low-E glass plate as the adherend. The sample is stored in an environment at 50° C. for seven days and then in a standard environment at 23° C., 50% RH for one hour. Subsequently, in the same standard environment, using a universal tensile tester, the aged peel strength (aged to-glass adhesive strength) (N/20 mm) is determined at a tensile speed of 0.3 m/min, at 180° peel angle. The Low-E glass plate used as the adherend is the same as the one used in the initial peel strength measurement.

(Peel Strength Ratio)

While no particular limitations are imposed, the protective sheet disclosed herein may have a ratio of aged peel strength $P_2$ (N/20 mm) to initial peel strength $P_1$ (N/20 mm) (i.e. a $P_2/P_1$ ratio value) of 5 or lower. A small $P_2/P_1$ ratio value indicates a small increase in peel strength with aging. By this, initial adhesion and light peel during removal are favorably combined. From such a standpoint, the $P_2/P_1$ ratio is preferably 4 or lower, more preferably 3 or lower, or yet more preferably 2 or lower, for instance, 1.8 or lower, 1.5 or lower, or even 1.3 or lower. The $P_2/P_1$ ratio is typically 0.8 or higher; it can be, for instance, 1 or higher.

(VOC Emission)

From the standpoint of environmental sanity, the protective sheet disclosed herein preferably has a total amount of volatile organic compounds (VOC) of 1000 μg or less emitted from 1 g thereof (possibly including a substrate layer and a PSA layer, but not a release liner) when heated at 80° C. for-30 minutes (or, for short, a VOC emission of 1000 μg/g or less). The VOC emission is more preferably 500 μg/g or less (e.g. 300 μg/g or less, typically 100 μg/g or less). The VOC emission is determined by the next method.

[VOC Test]

The protective sheet is cut to a prescribed size (to an about 5 cm² sized area, here) and the release liner is removed to prepare a test piece. The test piece is placed and sealed in a 20 mL vial. The vial is then heated at 80° C. for 30 minutes and 1.0 mL of the heated gas (sample gas) is injected into a gas chromatograph (GC), using a head space autosampler (HSS). Based on the resulting gas chromatogram, the amount of gas emitted from the test piece is determined as an n-decane equivalent amount. From the resulting value, the VOC emission is determined per gram of protective sheet (μg/g, excluding the release liner). The n-decane equivalent amount is determined by applying a calibration curve prepared in advance for n-decane, with the intensities of emission gas obtained by GC Mass seen as equivalent to the intensities of n-decane. The HSS and GC settings are as follows:

HSS: Model 7694 Available from Agilent Technologies
    Heating time: 30 min
    Pressurization time: 0.12 min
    Loop filling time: 0.12 min
    Loop equilibration time: 0.05 min
    Injection time: 3 min
    Sample loop temperature: 160° C.
    Transfer line temperature: 200° C.

GC: Model 6890 Available from Agilent Technologies
    Column: J&W capillary column, product name DB-ffAP, available from GL Science (0.533 mm inner diameter× 30 m length, 1.0 μm thick membrane)
    Column temperature: 250° C. (temperature raised at 10° C./min from 40° C. to 90° C., followed at 20° C./min to 250° C. and maintained there for 5 min)
    Colum pressure: 24.3 kPa (constant flow mode)
    Carrier gas: helium(5.0 m/min)
    Injection port: split (split ratio 12:1)
    Injection port temperature: 250° C.
    Detector: FID
    Detector temperature: 250° C.

The protective sheet disclosed herein may have a level of alteration resistance graded as no discoloration in the Low-E glass plate discoloration test (at 40° C. and 92% RH for 2 weeks) carried out by the method described later in Examples. The protective sheet satisfying this property can show excellent alteration resistance in applications for protecting Low-E glass plates.

<Applications>

The protective sheet disclosed herein is favorable as a protective sheet for a glass plate used as a building material such as window glass, etc. The glass plate subject to application can be a Low-E glass plate having a Low-E layer on its surface. The Low-E layer disclosed herein comprises a zinc component. Other than this, it is not particularly limited. The alteration-preventing/inhibiting effect of the art disclosed herein works on a Low-E layer comprising a zinc component which serves as a source for alteration by ammonia. A general Low-E layer includes a metal layer, an oxide layer such a metal oxide layer and a nitride layer such as a silicon nitride layer. The Low-E layer usually has a multi-layer structure and can be typically formed by a known or conventional method such as sputtering. Examples of the material forming each layer in the Low-E layer include $TiO_2$, $ZrO_2$, $Si_xN_y$, $ZnO_x$, Ag, $NiCrO_x$, $SnO_2$ and ZTO (oxide of zinc and tin). As the infrared-reflective layer, a Ag layer is preferably used. The Ag layer can be formed of Ag alone or an alloy of Ag and other metal (Pd, etc.). The Low-E layer may typically have one, two or more zinc-containing layers. While no particular limitations are imposed, in the Low-E layer according to some embodiments, the Ag layer can be present between any two of oxide layers such as $TiO_2$ layers, $ZrO_2$ layers, $ZnO_x$ layers, $NiCrO_x$ layers, $SnO_2$ layers and ZTO layers or nitride layers such as $Si_xN_y$ layers. The material of the Low-E layer's outermost surface (to which the protective sheet is applied) is often an oxide such as $TiO_2$, $ZrO_2$, $ZnO_x$, $NiCrO_x$, $SnO_2$ and ZTO or a nitride such as $Si_xN_y$; it typically is not a metal such as Ag. Depending on the purpose and required properties, the Low-E layer may have a multi-layer structure with 5 or more layers, for instance, 10 or more layers, or even 15 or more layers. The thickness of each layer is not particularly limited. It is usually 1000 Å or less, or suitably about 10 Å to 700 Å, for instance, about 30 Å to 300 Å. The thickness (overall thickness) of the Low-E layer can be about 10 nm to 1000 nm (e.g. about 50 nm to 500 nm).

In an embodiment where the Low-E layer of the Low-E glass plate has a zinc-containing layer, one zinc-containing layer has a thickness of, for instance, about 100 nm or less, or suitably about 70 nm or less (e.g. about 30 nm or less); and, for instance, about 1 nm or greater, or suitably about 3 nm or greater (e.g. about 8 nm or greater). Typical examples of the zinc-containing layer include a zinc oxide-containing layer. The zinc oxide-containing layer can be formed from zinc oxide or an oxide of zinc and other element (e.g. tin).

The zinc-containing layer can be present on the outer surface (outermost surface) of the Low-E layer or internal to the Low-E layer. In an embodiment where the zinc-containing layer is internal to the Low-E layer, the distance (thickness) from the Low-E layer's outer surface to the zinc-containing layer is not particularly limited and it is, for instance, about 300 nm or less, or suitably about 200 nm or less (e.g. about 100 nm or less). In such an embodiment, the effect of the art disclosed herein can be preferably obtained. The minimum distance (thickness) from the Low-E layer's outer surface to the zinc-containing layer is not particularly limited and it is, for instance, about 1 nm or greater, or possibly about 10 nm or greater.

In producing the glass plate, the Low-E layer surface may be left exposed until two glass plates including the Low-E glass plate are assembled into a pair-glass (e.g. dual-pane glass) with the Low-E-layer-side surface on the inside. The protective sheet disclosed herein is preferably used to prevent the Low-E layer surface from alteration. In other words, the protective sheet can be used as a protective sheet for a Low-E layer surface. In the protection period, the Low-E glass plate having the protective sheet applied thereon may be in a laminate form where the Low-E glass plate and the protective sheet are laminated. Accordingly, the art disclosed herein provides a laminate having a Low-E glass plate and a protective sheet. The particulars of the Low-E glass plate and protective sheet are as described above and thus are not repeated here.

In the laminate, the protective sheet is preferably adhered to the Low-E glass plate with a 180° peel strength of 5 N/20 mm or less. From the standpoint of the light peel, the peel strength is more preferably about 2.5 N/20 mm or less (e.g. about 2 N/20 mm or less). The peel strength is, for instance, about 0.01 N/20 mm or greater, or suitably about 0.05 N/20 mm or greater (e.g. about 0.1 N/20 mm or greater). From the standpoint of the tightness of adhesion between the Low-E glass plate and the protective sheet, it is preferably about 0.5 N/20 mm or greater (e.g. about 1 N/20 mm or greater), or possibly even 1.5 N/20 mm or greater. The protective sheet laminated to the Low-E glass plate with such peel strength is less likely to sort of lift or peel from the Low-E glass plate and can provide good protection. For the peel strength measurement conditions, other than using the protective sheet applied to the Low-E glass plate, basically the same peeling conditions for the aforementioned initial peel strength measurement are applied. The peel strength (N/20 mm) is obtained by multiplying 20 (mm) and the quotient of the measured value (N) divided by the measured width (mm).

From the standpoint of the efficiency of removal, the protective sheet disclosed herein is preferably used on an adherend having a large surface area on which the peel strength tends to be limited. The protective sheet disclosed herein is preferably used in an embodiment where it covers the entire surface of an adherend having a width of about 1 m or greater, for instance, about 1.5 m or greater, or even 2 m or greater (typically about 3 m or greater or even about 3.3 m or greater). The length of the adherend surface is equal to or greater than the width. In a preferable embodiment, it is preferably used in an embodiment where it entirely covers the surface of one face of a large flat plate (favorably, a flat plate with a smooth surface). In particular, glass plates used for building materials such as window glass are becoming progressively larger in view of efficient production, transportation, etc. It is preferably used in an embodiment where it covers the entire surface of a glass plate (typically the entire Low-E layer surface of the Low-E glass plate) having a large surface area (e.g. with a surface width greater than 2.6 m, typically about 3 m or greater, or even about 3.3 m or greater). A preferable embodiment of the art disclosed herein can bring about great alteration resistance while maintaining light peel with respect to an adherend having such a large surface area.

The protective sheet disclosed herein may further show suppressed aged adhesive strength and thus may provide good efficiency of removal even when, for instance, the period of adhesion to the adherend (which can be the protection period for the adherend) becomes relatively long (typically two weeks or longer, e.g. four weeks or longer). Thus, for instance, it can be favorably used in an embodiment where the protective sheet is removed from the adherend (in particular, a Low-E glass plate) after being applied thereon for two weeks or more (e.g. four weeks or more).

Low-E glass plates have higher levels of heat blocking or thermal insulation as compared to conventional glass plates and can improve the efficiency to cool down or heat up indoor spaces; and therefore, they are widely used as building materials such as window glass. When used in manufacturing such materials, the art disclosed herein may indirectly contribute to energy saving and reduction of greenhouse gas emissions.

The matters disclosed by this description include the following:

(1) A method for producing a glass unit, the method comprising:
- a step (A) of obtaining a Low-E glass plate having a Low-E layer;
- a step (B) of applying a protective sheet to a surface of the Low-E layer of the Low-E glass plate;
- an optional step (C) of subjecting the Low-E glass plate to at least one process selected from the group consisting of transportation, storage, processing, washing and handling;
- a step (D) of removing the protective sheet from the Low-E glass plate; and
- a step (E) of assembling a glass unit using the Low-E glass plate;
- wherein
- the protective sheet has a pressure-sensitive adhesive (PSA) layer,
- the Low-E layer comprises a zinc component, and
- the PSA layer includes less than 850 µg ammonia per gram of PSA layer weight, determined by hot water extraction.

(2) The method according to (1) above, wherein the Low-E glass plate has a width of 1 m or greater.

(3) The method according to (1) above, wherein the Low-E glass plate has a width of 2 m or greater.

(4) The method according to (1) above, wherein the Low-E glass plate has a width greater than 2.6 m.

(5) The method according to (1) above, wherein the Low-E glass plate has a width of 3 m or greater.

(6) The method according to any of(1) to (5) above, wherein the Low-E layer comprises a zinc-containing layer.

(7) The method according to any of(1) to (5) above, wherein the Low-E layer comprises a zinc oxide layer.

(8) The method according to any of(1) to (7) above, wherein the Low-E layer has a thickness of 1000 nm or less.

(9) The method according to any of(1) to (8) above, wherein the step (B) includes a step of entirely covering one face of the Low-E glass plate with one or more said protective sheets.

(10) The method according to any of (1) to (9) above, wherein the step (C) is essential and in the step (C), the Low-E glass plate is washed using water.

(11) A method for protecting a Low-E glass plate, the method comprising a step (application step) of applying a protective sheet to a surface of a Low-E glass plate that has a Low-E layer, wherein
- the protective sheet has a PSA layer,
- the Low-E layer comprises a zinc component, and
- the PSA layer includes less than 850 µg ammonia per gram of PSA layer weight, determined by hot water extraction.

(12) The method according to (11) above,
- the method further comprising a step (removal step) of removing the protective sheet from the Low-E glass plate, and
- the method optionally including, between the application step and the removal step, at least one process selected from the group consisting of transportation, storage, processing, washing and handling of the Low-E glass plate with the protective sheet adhered thereon.

(13) The method according to (11) or (12) above, wherein the Low-E glass plate has a width of 1 m or greater, and the application step comprises a step of entirely covering one face of the Low-E glass plate with one or more said protective sheets.

(14) The method according to (1) to (13) above, wherein the protective sheet is adhered to the Low-E glass plate with a 180° peel strength of 5 N/20 mm or less.

(15) The method according to any of(1) to (14) above, wherein the PSA layer is formed from a water-dispersed PSA composition.

(16) The method according to (15) above, wherein the PSA layer is an acrylic PSA layer comprising an acrylic polymer or a rubber-based PSA layer comprising a rubber-based polymer.

(17) The method according to any of(1) to (16), wherein the protective sheet has a substrate layer.

(18) The method according to (17) above, wherein the substrate layer is formed from a resin film.

(19) The method according to (17) or (18) above, wherein the substrate layer is formed from a polyolefinic resin film, polyester-based resin film or vinyl chloride-based resin film.

(20) The method according to (1) to (19) above, wherein the Low-E layer comprises a zinc-containing layer (e.g. a zinc oxide layer).

(21) A protective sheet having a PSA layer, wherein the PSA layer includes less than 850 µg ammonia per gram of PSA layer weight, determined by hot water extraction.

(22) The protective sheet according to (21) above, wherein the PSA layer is formed from a water-dispersed PSA composition.

(23) The protective sheet according to (21) or (22), wherein the PSA layer includes ammonia.

(24) The protective sheet according to any of (21) to (23) above, wherein the PSA layer is an acrylic PSA layer comprising an acrylic polymer, or a rubber-based PSA layer comprising a rubber-based polymer.

(25) The protective sheet according to any of (21) to (24) above, having a substrate layer, wherein the substrate layer is formed from a resin film.

(26) The protective sheet according to (21) to (25) above, having a 180° peel strength of 5 N/20 mm or less to a Low-E glass plate.

(27) The protective sheet according to any of (21) to (26), wherein the protective sheet is a Low-E glass plate protective sheet.

(28) The protective sheet according to any of (21) to (27) above, wherein the protective sheet is used for protecting a Low-E glass plate having a Low-E layer including a zinc component.

(29) The protective sheet according to any of (21) to (27) above, wherein the protective sheet is used for protecting a Low-E glass plate that comprises a Low-E layer having a zinc-containing layer.

(30) The protective sheet according to any of (21) to (27) above, wherein the protective sheet is used for protecting a Low-E glass plate that comprises a Low-E layer having a zinc oxide layer.

(31) A laminate having a Low-E glass plate and a protective sheet protecting the Low-E glass plate surface, wherein
- the Low-E glass plate has a Low-E layer including a zinc component,
- the protective sheet has a PSA layer, and
- the PSA layer includes less than 850 µg ammonia per gram of PSA layer weight, determined by hot water extraction.

(32) The laminate according to (31) above, wherein the Low-E layer comprises a zinc-containing layer.

(33) The laminate according to (31) above, wherein the Low-E layer comprises a zinc oxide layer.

(34) The laminate according to any of (31) to (33) above, wherein the PSA layer is formed from a water-dispersed PSA composition.

(35) The laminate according to any of (31) to (34) above, wherein the PSA layer includes ammonia.

(36) The laminate according to any of (31) to (35) above, wherein the PSA layer is an acrylic PSA layer comprising an acrylic polymer or a rubber-based PSA layer comprising a rubber-based polymer.

(37) The laminate according to any of (31) to (36) above, having a substrate layer, wherein the substrate layer is formed from a resin film.

(38) The laminate according to any of (31) to (37) above, wherein the protective sheet is adhered to the Low-E glass plate with a 180° peel strength of 5 n/20 mm or less.

EXAMPLES

Several experimental examples related to the present invention are described below, but the present invention should not be limited to these experimental examples. In the description below, "part(s)" and "%" are by weight unless otherwise specified.

<Test Methods>
[Ammonia Content of PSA (Layer)]

About 10 mg of PSA (adhesive components) of the protective sheet subject to measurement is obtained, placed in a polypropylene (PP) container and weighed. Subsequently, 100 mL of ultrapure water is added and a lid is placed. The resultant is subjected to hot water extraction for one hour in a dryer at 120° C. With respect to the resulting extract, by ion chromatography, ammonium ions in the extract are quantified using commercial standard ammonium ion solutions (available from FUJIFILM Wako Pure Chemical industries, Ltd.) to determine the ammonia content per gram of PSA used in the extraction. The ion chromatography conditions are as shown below.

(Analytical Conditions)
  System: DX-320 available from Thermo Fisher Scientific
  Separation column: Dionex Ion Pac CS16 (5 mm×250 mm)
  Guard column: Dionex Ion Pac CG16 (5 mm×50 mm)
  Removal system: Dionex CSRS-500 (recycle mode)
  Detector: electrical conductivity detector
  Eluent: aqueous methanesulfonic acid solution
  Eluent flow rate: 1.0 mL/min
  Sample injection volution: 25 µL

[Discoloration Test of Low-E Glass Plate]

The protective sheet is cut to a 20 mm wide, 100 mm long strip to prepare a test piece. In a standard environment at 23° C. and 50% RH, the test piece is press-bonded to the Low-E layer surface of a test Low-E glass plate as the adherend with a 2 kg rubber roller moved back and forth twice. The sample is stored in an environment at 40° C. and 92% RH for two weeks and the protective sheet is then removed. With respect to the area protected with the protective sheet, the state of the glass plate surface is inspected under an optical microscope. The following grades are assigned: "Excellent" when no discoloration is observed, "Good" when a practically acceptable level of minor discoloration is observed, and "Fail" when discoloration is observed.

<Preparation of Low-E Glass Plates for Testing>

Preparation Example A1

Using a sputtering machine, on one face of a 3 mm thick float glass plate (available from Matsunami Glass Ind., Ltd.; 91% visible light transmission), the followings were formed in order by direct magnetron sputtering: a 10 nm thick titanium oxide layer (or sometimes abbreviated to as "$TiO_2$ layer" for convenience, hereinafter), a 10 nm thick zinc oxide layer (or sometimes abbreviated to as "ZnO layer" hereinafter), a 15 nm thick Ag—Pd alloy layer (or sometimes abbreviated to as "Ag layer" hereinafter), a 10 nm thick zinc oxide layer (ZnO layer) and a 10 nm thick titanium oxide layer ($TiO_2$ layer). Sintered titanium oxide was used as a target to form the titanium oxide layers and sputtering was carried out at a power density of 2.67 W/cm$^2$ at a process pressure of 0.4 Pa. During this, the amount of gas introduced to the sputtering chamber was adjusted to obtain an Ar to O2 ratio of 98:2 (by volume). For the formation of the zinc oxide layer, sintered zinc oxide was used as the target and sputtering was carried out at a power density of 2.67 W/cm$^2$ at a process pressure of 0.4 Pa. During this, the amount of gas introduced into the sputtering chamber was adjusted so as to obtain an Ar to O2 ratio of 98:2 (by volume). For the formation of the Ag—Pd alloy layer, using a metal target comprising silver and palladium at a weight ratio (Ag:Pd) of 96.4:3.6, sputtering was carried out at a power density of 1.33 W/cm$^2$ at a process pressure of 0.4 Pa. In this manner, was prepared a test Low-E glass plate A1 having $TiO_2$ layer, ZnO layer, Ag layer, ZnO layer and $TiO_2$ layer (outermost layer) laminated in this order.

Preparation Example A2

Low-E layers were laminated in the following order starting from the glass plate side: $TiO_2$ layer, ZTO layer, Ag layer, ZTO layer and $TiO_2$ layer (outermost layer). Otherwise, basically in the same manner as Preparation Example A1, was prepared a test Low-E glass plate A2. It is noted that ZTO (zinc tin oxide) refers to an oxide of zinc and tin.

Preparation Example A3

Low-E layers were laminated in the following order starting from the glass plate side: $TiO_2$ layer, Ag layer and $TiO_2$ layer (outermost layer). Otherwise, basically in the same manner as Preparation Example A1, was prepared a test Low-E glass plate A3.

<Preparation of Protective Sheets>

Preparation Example B1

Were mixed a starting monomer mixture comprising 58 parts of 2-ethylhexyl acrylate, 40 parts of n-butyl methacrylate and 2 parts of acrylic acid with 3 parts of surfactant (trade name AQUALON KH-1025 available from Dai-ichi Kogyo Seiyaku Co., Ltd.; ammonium polyoxyethylene-1-(allyloxymethyl) alkyl ether sulfate with up to 30 moles of added EO) and 150 parts of deionized water. The resulting mixture was emulsified under nitrogen flow with an emulsifying machine (homo mixer) to prepare an emulsion of the starting monomers.

Into a reaction vessel equipped with a thermometer, nitrogen inlet, condenser and stirrer, was placed the emulsion and heated under nitrogen flow to a liquid temperature of 50° C. while stirring. To this, was added 0.03 part of 2,2'-azobis(2-methylpropionamidine)dihydrochloride (product name V-50 available from FUJIFILM Wako Pure Chemical industries, Ltd.) as polymerization initiator and the polymerization reaction was carried out for 5 hours while maintaining the liquid temperature around 50° C. To the resulting polymerization reaction mixture, was added ammonia water for adjusting pH. An aqueous dispersion of acrylic polymer was thus prepared.

Into the aqueous dispersion, per 100 parts of non-volatiles therein, was mixed 2 parts of oxazoline-based crosslinking agent (product name EPOCROS WS-500 available from Nippon Shokubai Co., Ltd.) to prepare a PSA composition according to this Example.

Of 55 μm thick polyethylene film having one face treated with corona discharge, onto the corona-treated face (first face), was applied the PSA composition with a bar coater to a dried thickness of 6 μm. This was dried at 70° C. for two minutes and then aged at 50° C. for one day to prepare an adhesively single-faced PSA sheet having an acrylic PSA layer on one face of a substrate layer formed of the polyethylene film. The resulting PSA sheet was used as the protective sheet B1 according to this Example.

Preparation Examples B2 to B5

The amount of ammonia (pH-adjusting agent) used to the water dispersion of acrylic polymer was gradually reduced and the drying time in the PSA layer formation was increased. Otherwise in the same manner as Preparation Example B1, were obtained protective sheets B2 to B5.

Preparation Example B6

In preparing the water dispersion of acrylic polymer, in place of ammonia, was used NaOH as the pH-adjusting agent. Otherwise in the same manner as Preparation Example B1, was obtained protective sheet B6.

Examples 1-8 and Reference Examples 9-10

As the protective sheets for test Low-E glass plates A1 to A3, using protective sheets B1 to B6 in the combinations shown in Table 1, the Low-E glass plate discoloration test was conducted. The results are shown in Table 1. Table 1 summarizes each Example and the ammonia content (amount of residual ammonia) per gram of PSA of protective sheet (μg/g).

Examples 4 to 5 with even lower ammonia content, discoloration was prevented to a greater extent. A similar trend was observed in Examples 6 to 7 tested with a Low-E glass plate comprising a different zinc component. In Example 8 using NaOH but not ammonia as the pH-adjusting agent, discoloration was not observed in the Low-E glass plate. With respect to Reference Examples 9 to 10 using a zinc-free Low-E glass plate, regardless of the amount of ammonia in PSA layer, no discoloration was observed in the Low-E glass plate. Based on these results, the ammonia in the PSA layer is thought to affect the zinc component of the Low-E layer to alter the Low-E layer, thereby causing discoloration of the Low-E glass plate. It is shown that alteration to a Low-E glass plate can be prevented or inhibited with a protective sheet with less than 850 μg ammonia per gram of PSA according to hot water extraction.

Although specific embodiments of the present invention have been described in detail above, these are merely for illustrations and do not limit the scope of the claims. The art according to the claims includes various modifications and changes made to the specific embodiments illustrated above.

REFERENCE SIGNS LIST

1: substrate layer
1A: first face
1B: second face
2: PSA layer
2A: adhesive face
10: protective sheet
100: Low-E glass plate
110: glass substrate
120: Low-E layer
200: protective sheet
300: glass unit
320: another glass unit
340: spacer

The invention claimed is:
1. A protective sheet for a Low-E glass plate, the protective sheet comprising a substrate and a pressure-sensitive adhesive layer formed thereon,

TABLE 1

|  | Ex. 1 | Ex. 2 | Ex. 3 | Ex. 4 | Ex. 5 | Ex. 6 | Ex. 7 | Ex. 8 | Ref. Ex. 9 | Ref. Ex. 10 |
|---|---|---|---|---|---|---|---|---|---|---|
| Low-E glass plate | A1 | A1 | A1 | A1 | A1 | A2 | A2 | A1 | A3 | A3 |
| Layer constitution | $TiO_2$ | $TiO_2$ | $TiO_2$ | $TiO_2$ | $TiO_2$ | $TiO_2$ | $TiO_2$ | $TiO_2$ | $TiO_2$ | $TiO_2$ |
|  | ZnO | ZnO | ZnO | ZnO | ZnO | ZTO | ZTO | ZnO | — | — |
|  | Ag | Ag | Ag | Ag | Ag | Ag | Ag | Ag | Ag | Ag |
|  | ZnO | ZnO | ZnO | ZnO | ZnO | ZTO | ZTO | ZnO | — | — |
|  | $TiO_2$ | $TiO_2$ | $TiO_2$ | $TiO_2$ | $TiO_2$ | $TiO_2$ | $TiO_2$ | $TiO_2$ | $TiO_2$ | $TiO_2$ |
| Protective sheet | B1 | B2 | B3 | B4 | B5 | B2 | B4 | B6 | B2 | B4 |
| pH-adjusting agent | $NH_3$ | $NH_3$ | $NH_3$ | $NH_3$ | $NH_3$ | $NH_3$ | $NH_3$ | NaOH | $NH_3$ | $NH_3$ |
| Amount of residual ammonia (μg/g) | 1256.3 | 927.4 | 834.1 | 569.1 | 354.3 | 927.4 | 569.1 | not detected | 927.4 | 569.1 |
| Low-E glass plate discoloration test | Fail | Fail | Good | Excellent | Excellent | Fail | Excellent | Excellent | Excellent | Excellent |

As shown in Table 1, from Example 1 towards Example 5, with decreasing amount of ammonia used as the pH-adjusting agent, the amount of residual ammonia in PSA also decreased. In Examples 1 to 2 higher in ammonia content of PSA layer, discoloration was observed in the Low-E glass plate discoloration test using a Low-E glass plate that comprises a zinc component. On the other hand, in Example 3 with an ammonia content less than 850 μg/g of PSA layer, discoloration of the Low-E glass plate was inhibited. In wherein the Low-E glass plate includes a Low-E layer comprising a zinc component, and the pressure-sensitive adhesive layer is adhered to the Low-E layer of the Low-E glass plate,
wherein
the pressure-sensitive adhesive layer in the protective sheet is formed from a water-dispersed pressure-sensitive adhesive composition, and
the pressure-sensitive adhesive layer includes ammonia, the ammonia content being 300 µg or greater and less than 850 µg per gram of pressure-sensitive adhesive layer, wherein the ammonia content is determined by hot water extraction.

2. The protective sheet according to claim 1, wherein the pressure-sensitive adhesive layer comprises an acrylic polymer as a base polymer, the acrylic polymer being a polymer of a monomer mixture comprising an alkyl (meth)acrylate.

3. The protective sheet according to claim 1, wherein the pressure-sensitive adhesive layer includes ammonia and a non-ammonia basic compound.

4. The protective sheet according to claim 1, wherein the pressure-sensitive adhesive layer further includes at least one basic compound selected from the group consisting of hydroxides of ammonia, carbonates of ammonia, bicarbonates of ammonia, hydroxides of alkali metals, carbonates of alkali metals, bicarbonates of alkali metals, hydroxides of alkali earth metals, carbonates of alkali earth metals, bicarbonates of alkali earth metals and organic amine-based compounds.

5. The protective sheet according to claim 1, wherein the pressure-sensitive adhesive layer further includes at least one basic compound selected from the group consisting of hydroxides of alkali metals and hydroxides of alkali earth metals.

6. The protective sheet according to claim 1, wherein the water-dispersed pressure-sensitive adhesive composition has a pH lower than 8.

7. The protective sheet according to claim 1, wherein the protective sheet has a width greater than 2.6 meters.

8. The protective sheet according to claim 1, wherein the protective sheet has a width of 3 meters or greater.

9. The protective sheet according to claim 1, wherein the protective sheet has a width of 3.3 meters or greater.

10. The protective sheet according to claim 1, wherein the protective sheet has an aged peel strength of 1 N/20 mm or greater and 5 N/20 mm or less, determined at a tensile speed of 0.3 m/min, at 180° peel angle, after applied to a Low-E glass plate and stored at 50° C. for 7 days.

11. A laminate formed with a Low-E glass plate including a Low-E layer comprising a zinc component; and
a protective sheet including a substrate and a pressure-sensitive adhesive layer provided to at least one face of the substrate,
wherein the protective sheet is adhered to the Low-E layer of the Low-E glass plate by the pressure-sensitive adhesive layer,
the pressure-sensitive adhesive layer in the protective sheet is formed from a water-dispersed pressure-sensitive adhesive composition, and
the pressure-sensitive adhesive layer includes ammonia, the ammonia content being 300 µg or greater and less than 850 µg per gram of pressure-sensitive adhesive layer, wherein the ammonia content is determined by hot water extraction.

12. The laminate according to claim 11, wherein the pressure-sensitive adhesive layer comprises an acrylic polymer as a base polymer, the acrylic polymer being a polymer of a monomer mixture comprising an alkyl (meth)acrylate.

13. The laminate according to claim 11, wherein the pressure-sensitive adhesive layer includes ammonia and a non-ammonia basic compound.

14. The laminate according to claim 11, wherein the protective sheet has a width of 3 meters or greater.

15. The laminate according to claim 11, wherein the protective sheet is adhered to the Low-E glass plate with a 180° peel strength of 1 N/20 mm or greater and 5 N/20 mm or less.

16. A protection method for a Low-E glass plate, the protection method comprising protecting the Low-E glass plate that includes a Low-E layer comprising a zinc component by applying a protective sheet that includes a substrate and a pressure-sensitive adhesive layer provided to at least one face of the substrate to the Low-E layer via the pressure-sensitive adhesive layer,
wherein the pressure-sensitive adhesive layer is formed from a water-dispersed pressure-sensitive adhesive composition and includes ammonia,
wherein the ammonia content being 300 µg or greater and less than 850 µg per gram of pressure-sensitive adhesive layer,
wherein the ammonia content is determined by hot water extraction.

17. The protection method according to claim 16, further comprising a step of removing the protective sheet from the Low-E glass plate; and between the application and removal of the protective sheet to and from the Low-E glass plate, a step of subjecting the Low-E glass plate having the protective sheet applied thereon to at least one process selected from the group consisting of transportation, storage, processing, washing and handling.

18. The protection method according to claim 16, wherein the Low-E glass plate has a width of 1 m or greater,
the application of the protective sheet to the Low-E glass plate comprises a step of entirely covering one face of the Low-E glass plate with at least one said protective sheet.

19. The protection method according to claim 16, wherein the protective sheet is adhered to the Low-E glass plate with a 180° peel strength of 5 N/20 mm or less.

20. A method for producing a glass unit, the method comprising
a step (A) of obtaining a Low-E glass plate having a Low-E layer;
a step (B) of applying a protective sheet to a surface of the Low-E layer of the Low-E glass plate;
an optional step (C) of subjecting the Low-E glass plate having the protective sheet applied thereon to at least one process selected from the group consisting of transportation, storage, processing, washing and handling;
a step (D) of removing the protective sheet from the Low-E glass plate; and
a step (E) of fabricating a glass unit using the Low-E glass plate; wherein
the Low-E layer comprises a zinc component,
the protective sheet includes a substrate and a pressure-sensitive adhesive layer provided to at least one face of the substrate,
the pressure-sensitive adhesive layer is adhered to the surface of the Low-E layer,
the pressure-sensitive adhesive layer is formed from a water-dispersed pressure-sensitive adhesive composition, and
the pressure-sensitive adhesive layer includes ammonia, the ammonia content being 300 µg or greater and less than 850 µg per gram of pressure-sensitive adhesive layer, wherein the ammonia content is determined by hot water extraction.

* * * * *